(12) United States Patent
Moore et al.

(10) Patent No.: US 9,131,619 B2
(45) Date of Patent: *Sep. 8, 2015

(54) DEVICES WITH SELECTABLE MOUNTING AND RELATED ASSEMBLIES AND KITS

(71) Applicant: WirePath Home Systems, LLC, Charlotte, NC (US)

(72) Inventors: David G. Moore, Fort Mill, SC (US); John Hatcher, Fort Mill, SC (US); Mark H. Linton, Richmond, KY (US)

(73) Assignee: Wirepath Home Systems, LLC, Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/224,918

(22) Filed: Mar. 25, 2014

(65) Prior Publication Data

US 2014/0202727 A1    Jul. 24, 2014

Related U.S. Application Data

(63) Continuation of application No. 13/547,593, filed on Jul. 12, 2012, now Pat. No. 8,697,990.

(51) Int. Cl.
*H02G 3/08*    (2006.01)
*H05K 7/14*    (2006.01)
*H01R 27/02*   (2006.01)
*H01R 29/00*   (2006.01)

(52) U.S. Cl.
CPC ................ *H05K 7/14* (2013.01); *H01R 27/02* (2013.01); *H01R 29/00* (2013.01); *H05K 7/1457* (2013.01)

(58) Field of Classification Search
CPC ....... H05K 7/14; H05K 7/1457; H01R 27/02; H01R 29/00
USPC ........................ 174/50, 58; 439/535; 248/906
See application file for complete search history.

(56) References Cited

U.S. PATENT DOCUMENTS

| | | |
|---|---|---|
| 2,907,855 A | 10/1959 | Hedges |
| 2,979,624 A | 4/1961 | Askerneese |
| 2,988,655 A | 6/1961 | Rudolph et al. |
| 3,199,068 A | 8/1965 | Neenan |
| 4,109,231 A | 8/1978 | Krouse |
| 4,603,789 A | 8/1986 | Medlin, Sr. |
| 4,863,399 A | 9/1989 | Medlin, Jr. |
| 5,263,676 A | 11/1993 | Medlin et al. |
| 5,359,540 A | 10/1994 | Ortiz |
| 5,424,903 A | 6/1995 | Schreiber |
| 5,594,494 A | 1/1997 | Okada et al. |
| 6,211,581 B1 | 4/2001 | Farrant |

(Continued)

*Primary Examiner* — Dhirubhai R Patel
(74) *Attorney, Agent, or Firm* — Myers Bigel Sibley & Sajovec, PA

(57) ABSTRACT

A power conditioner assembly includes: first and second brackets and a power conditioner. Each bracket includes a rear portion adapted to attach to a rear portion of an equipment rack and a front portion that extends frontwardly. The power conditioner includes a housing having a rear panel, a first side panel mounted to the first bracket and a second, opposed side panel mounted to the second bracket. The power conditioner is mountable to the brackets in a plurality of orientations including: a rearward orientation with the rear panel oriented substantially vertically; and at least one angled orientation with the rear panel at an oblique angle to vertical. The brackets may also be adapted to attach to other mounting surfaces and/or other brackets may be provided for this purpose to provide additional mounting options.

22 Claims, 17 Drawing Sheets

(56) References Cited

U.S. PATENT DOCUMENTS

| | | |
|---|---|---|
| 6,229,691 B1 | 5/2001 | Tanzer et al. |
| 6,262,880 B1 | 7/2001 | Fischer et al. |
| 6,509,655 B1 | 1/2003 | Wang |
| 6,586,849 B2 | 7/2003 | Tarr |
| 6,741,442 B1 | 5/2004 | McNally et al. |
| 6,765,146 B1 * | 7/2004 | Gerardo .......................... 174/58 |
| 6,862,187 B2 | 3/2005 | Robbins et al. |
| 6,906,925 B2 | 6/2005 | Robbins et al. |
| 7,324,006 B2 | 1/2008 | Godard |
| 7,457,106 B2 | 11/2008 | Ewing et al. |
| 7,522,036 B1 | 4/2009 | Preuss et al. |
| 7,663,866 B2 | 2/2010 | Lee et al. |
| 7,699,283 B2 * | 4/2010 | Vrame et al. ................. 248/317 |
| 8,110,942 B2 | 2/2012 | Ensinger |
| 2001/0026436 A1 | 10/2001 | Tanzer et al. |
| 2011/0101777 A1 | 5/2011 | Jansma |

\* cited by examiner

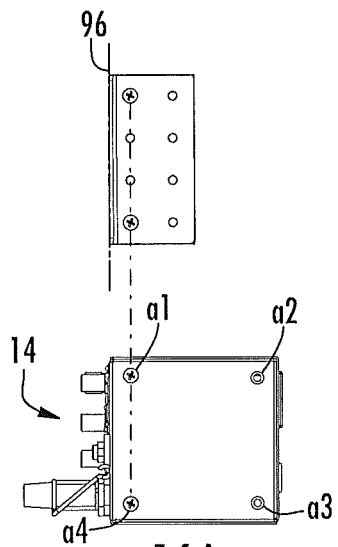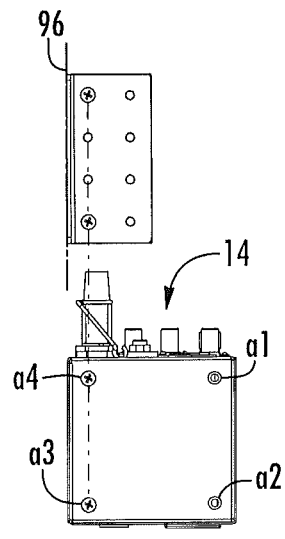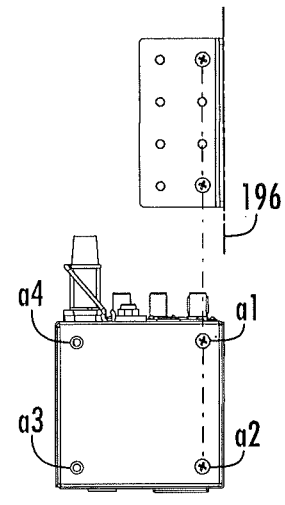
FIG. 16A    FIG. 16B    FIG. 16C
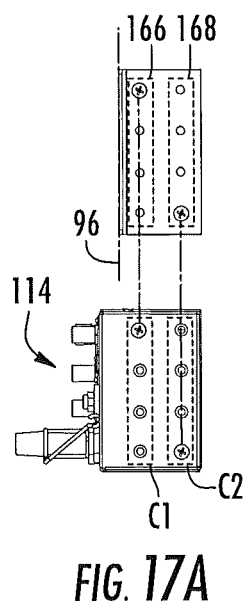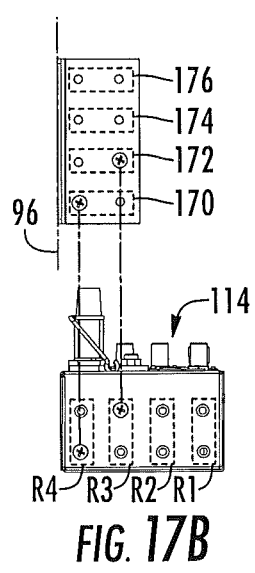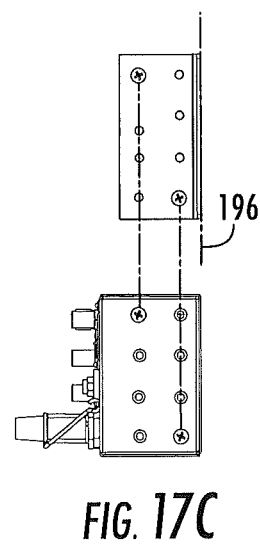
FIG. 17A    FIG. 17B    FIG. 17C

DEVICES WITH SELECTABLE MOUNTING AND RELATED ASSEMBLIES AND KITS

RELATED APPLICATIONS

This is a continuation of U.S. patent application Ser. No. 13/547,593, filed Jul. 12, 2012, now U.S. Pat. No. 8,697,990, the disclosure of which is incorporated herein in its entirety.

FIELD OF THE INVENTION

This invention relates to power products and, more particularly, to power products with selectable mounting and related assemblies and kits.

BACKGROUND

Power products, such as power conditioners, are often mounted in equipment racks and cabinets. It is desirable to arrange the power product such that the outlets are positioned near the back of the rack for easier connection with other components.

Traditional chassis-based power products put the outlets close to the front of the rack, making them difficult to reach. Some manufacturers have padded the chassis with a substantial amount of "dead space" in an effort to move the outlets closer to the back of the rack. However, this adds cost, wastes space, and does not fully address the problem of outlet accessibility. Moreover, these power products cannot be easily orientated in a variety of ways relative to the rack or equipment therein.

SUMMARY

Some embodiments of the invention are directed to a power conditioner assembly including first and second brackets and a power conditioner. Each bracket has a rear portion adapted to attach to a rear portion of an equipment rack, and each bracket has a front portion that extends frontwardly and, when attached, defines a top row of a plurality of apertures, a bottom row of a plurality of apertures, and a middle row of a plurality of apertures positioned between the top and bottom rows. The power conditioner includes a housing having a rear panel, a first side panel mounted to the first bracket and a second, opposed side panel mounted to the second bracket. The rear panel includes a plurality of outlets for connecting equipment, and each of the first and second side panels includes at least four apertures.

The power conditioner is mountable to the brackets in a plurality of orientations including: a rearward orientation with the rear panel oriented substantially vertically, wherein one of the at least four apertures of each power conditioner side panel is aligned with one of the apertures of one of the top and bottom rows of a respective bracket and another one of the at least four apertures of the power conditioner side panel is aligned with one of the apertures of the other one of the top and bottom rows of the respective bracket; and at least one angled orientation with the rear panel at an oblique angle relative to vertical, wherein two of the at least four apertures of each power conditioner side panel are aligned with two of the apertures of the middle row of a respective bracket.

The at least one angled orientation may include both of: an upward angled orientation, wherein at least a majority of the power conditioner top panel is positioned further from the rear bracket portions than at least a majority of the power conditioner bottom panel; and a downward angled orientation, wherein at least a majority of the power conditioner bottom panel is positioned further from the rear bracket portions than at least a majority of the power conditioner top panel. According to some embodiments, in the upward angled orientation, two of the at least four apertures of each power conditioner side panel are aligned with two of the apertures of the middle row of a respective bracket. In the downward angled orientation, a different two of the at least four apertures of each power conditioner side panel are aligned with two of the apertures of the middle row of a respective bracket.

The power conditioner may be mountable in an upward orientation, wherein the rear panel is substantially perpendicular to vertical and the top panel is positioned further away from the rear bracket portions than the bottom panel. The power conditioner may also be mountable in a downward orientation, wherein the rear panel is substantially perpendicular to vertical and the bottom panel is positioned further away from the rear bracket portions than the top panel.

According to some embodiments, the power conditioner is mountable in a non-recessed orientation, wherein a pair of the at least four apertures of each side panel is aligned with a first aperture and a second aperture of a respective bracket. The power conditioner is also mountable in a recessed orientation, wherein the pair of the at least four apertures of each side panel is aligned with a third aperture of the respective bracket that is located a greater distance from the bracket rear portion than the first aperture and a fourth aperture of the respective bracket that is located a greater distance from the bracket rear portion than the second aperture.

Some other embodiments of the invention are directed to a power conditioner assembly including: an equipment rack, first and second brackets and a power conditioner. The rack has first and second spaced-apart rear rails and first and second spaced-apart front rails, with the first and second rear rails defining a rear vertical plane therebetween. The first bracket is attached to the first rear rail and the second bracket attached to the second rear rail. Each bracket includes a rear portion attached to a respective rail and a front portion that extends frontwardly. Each bracket front portion includes a top row of a plurality of apertures, a bottom row of a plurality of apertures, and a middle row of a plurality of apertures positioned between the top and bottom rows. The power conditioner includes a housing having a rear panel, a first side panel mounted to the first bracket and a second, opposed side panel mounted to the second bracket. The rear panel includes a plurality of outlets for connecting equipment, and each of the first and second side panels includes at least four apertures.

The power conditioner is mountable to the brackets in a plurality of orientations including: a rearward orientation with the rear panel substantially parallel to the rear vertical plane, wherein one of the at least four apertures of each power conditioner side panel is aligned with one of the apertures of one of the top and bottom rows of a respective bracket and another one of the at least four apertures of the power conditioner side panel is aligned with one of the apertures of the other one of the top and bottom rows of the respective bracket; and at least one angled orientation with the rear panel at an oblique angle to the rear vertical plane, wherein two of the at least four apertures of each power conditioner side panel are aligned with two of the apertures of the middle row of a respective bracket.

The power conditioner may be sized such that, when mounted, the power conditioner extends only a minor distance from a rear portion to a front portion of the rack.

The power conditioner assembly may further include a faceplate mountable to the rack front rails in a spaced-apart relationship to the power conditioner, the faceplate having a housing including a rear panel having at least one interface for interconnection with at least one interface on a front panel of the power conditioner and a front panel having at least one indicator for monitoring the power conditioner. In various embodiments, the faceplate may provide diagnostic and/or real-time information about the power conditioner and may include at least one USB charging port and/or at least one utility outlet.

Some other embodiments are directed to power conditioner kit including: a power conditioner, a pair of first brackets and a pair of second brackets. The power conditioner includes a housing having a rear panel including a plurality of outlets for connecting equipment. Each of the first brackets is adapted to attach to a rear portion of an equipment rack, and each first bracket has a front portion that extends frontwardly, wherein the power conditioner is mountable to the front portions of the first brackets in a plurality of orientations including: a flush rearward orientation with the rear panel oriented substantially vertically; at least one angled orientation with the rear panel at an oblique angle relative to vertical; and a recessed rearward orientation with the rear panel oriented substantially vertically and positioned frontwardly relative to the flush rearward orientation. Each of the second brackets includes first and second substantially perpendicular portions. The first portion of each of the second brackets is adapted to attach to a rear portion of an equipment rack, and the power conditioner is mountable to the second portion of the second brackets in a plurality of orientations relative to the rear portion of the equipment rack. The first portion of each of the second brackets is also adapted to attach to a flat mounting surface, and the power conditioner is mountable to the second portion of the second brackets in a plurality of orientations relative to the flat mounting surface.

BRIEF DESCRIPTION OF THE FIGURES

FIGS. 16A-16C illustrate various mounting orientations using the bracket of FIGS. 15A and 15B for the power conditioner of FIG. 1.

FIGS. 17A-17C illustrate various mounting orientations using the bracket of FIGS. 15A and 15B for the power conditioner of FIG. 12.

DETAILED DESCRIPTION OF EMBODIMENTS OF THE INVENTION

Figure 1:
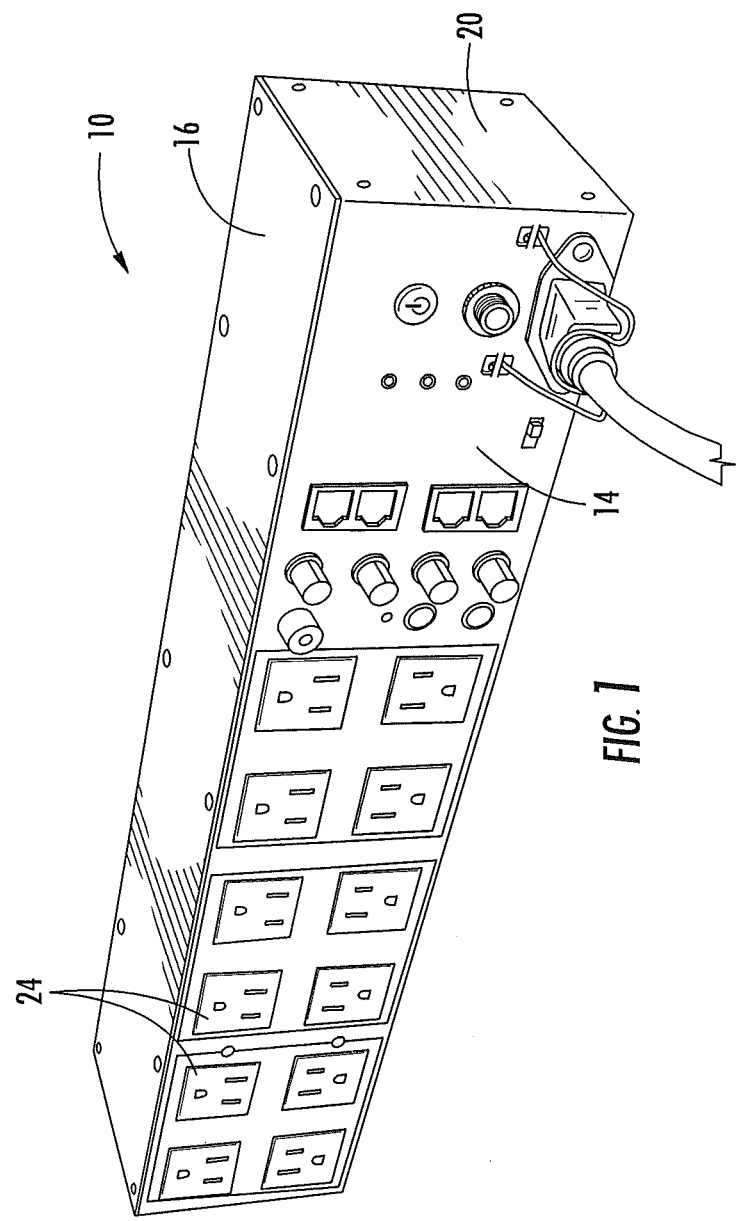
FIG. 1 is a rear perspective view of a power conditioner according to some embodiments.

The present invention now will be described more fully with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Thicknesses and dimensions of some components may be exaggerated for clarity.

As used herein, the term "comprising" or "comprises" is open-ended, and includes one or more stated features, integers, elements, steps, components or functions but does not preclude the presence or addition of one or more other features, integers, elements, steps, components, functions or groups thereof. As used herein, the term "and/or" includes any and all combinations of one or more of the associated listed items.

As used herein, the common abbreviation "e.g.," which derives from the Latin phrase "exempli gratia," may be used to introduce or specify a general example or examples of a previously mentioned item, and is not intended to be limiting of such item. If used herein, the common abbreviation "i.e.," which derives from the Latin phrase "id est," may be used to specify a particular item from a more general recitation.

The terminology used herein is for the purpose of describing particular embodiments only and is not intended to be limiting of the invention. As used herein, the singular forms "a," "an" and "the" are intended to include the plural forms as well, unless the context clearly indicates otherwise.

Well-known functions or constructions may not be described in detail for brevity and/or clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, spatially relative terms, such as "under," "below," "lower," "over," "upper," "downward," "upward," "inward," "outward" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present.

It is noted that any one or more aspects or features described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

As used herein, the term "about" used in connection with a claimed value means +/−10% or +/−20% of the claimed value in various embodiments.

As used herein, the term "power conditioner" means a device intended to provide power protection and/or improve the quality of the power that is delivered to electrical load equipment. An exemplary power conditioner is a surge protector.

As used herein, the term "mounting structure" means a structure to which a power conditioner may be mounted, either directly or indirectly. Exemplary mounting structures are equipment cabinets and racks. As used herein, the term "mounting surface" means a planar surface such as a wall or panel within a cabinet or rack.

As used herein, the term "equipment rack" means a frame or enclosure for mounting one or more pieces of equipment. Equipment racks may be floor standing or may fit within an enclosure, such as an in-cabinet rack.

A power conditioner 10 according to some embodiments is illustrated in FIGS. 1-5. The power conditioner 10 includes a housing having a front panel 12, a rear panel 14, a top panel 16, a bottom panel 18, a first side panel 20, and a second, opposed side panel 22.

Figure 2:
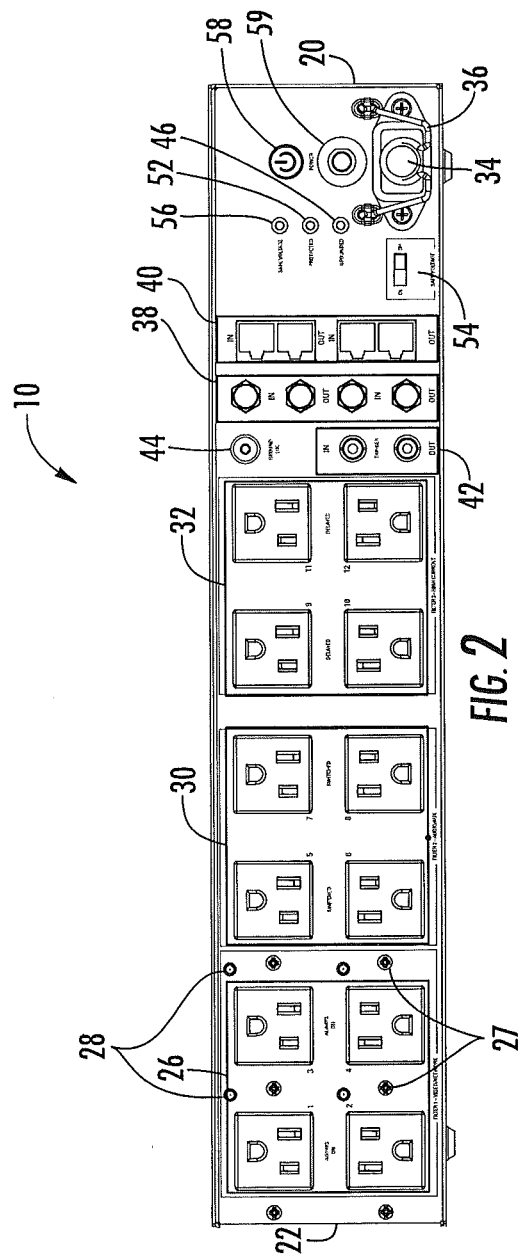
FIG. 2 is a rear view of the power conditioner of FIG. 1.

The rear panel 14 includes a plurality of outlets 24 for connecting components or equipment. In the illustrated embodiment, the rear panel 14 includes 12 outlets, although a lesser or greater number of outlets is contemplated. Referring to FIG. 2, the outlets 24 may be segregated into different groups, such as the "always on" outlets 26 and the sequenced outlets 30, 32. The always on outlets 26 help ensure that critical devices (e.g., DVRs, network switches and control systems) are ready when needed. An indicator 28 (e.g., a green LED) illuminates to indicate and provide visual feedback that power is being supplied to each individual outlet 24. In some embodiments, the always on outlets will only be turned off when a "Safe Voltage" feature (described in more detail below) is providing protection from a sustained under/over voltage condition.

The sequenced outlets 30, 32 may be used to sequentially turn equipment on and off. The sequenced outlets may include a set of outlets 30 associated with a switched isolated filter for use with audio and auxiliary components. The sequenced outlets may also include a set of outlets 32 associated with a delayed/isolated filter for use with high current components. The sequenced outlets may provide certain advantages. Powering up large systems simultaneously or substantially simultaneously can cause an in-rush of current that can potentially trip the circuit breaker or disrupt other equipment. Also, in audio systems, it is desirable for the amplifiers to turn on after the preamps to prevent audible "pops" from connected speakers. The sequencing feature can address of both issues by turning on amplifiers and other high current equipment last. Similarly, when powering the system down, these same components will be turned off first.

Figure 3:
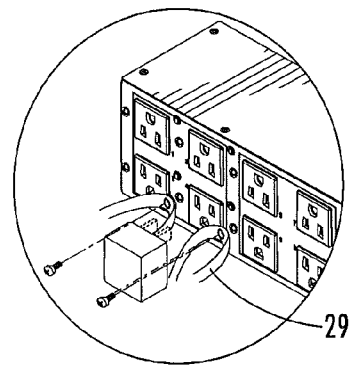
FIG. 3 is a front perspective view of a portion of the power conditioner of FIG. 1.

Attachment members 27 are positioned adjacent at least some of the outlets 24. The attachment members 27 are configured to engage at least one strap 29, as shown in FIG. 3. The straps 29 may be used to secure power adapters to the outlets 24. In some embodiments, and as illustrated, the attachment members 27 are fasteners such as screws. For example, a screw may be removed on each side of the outlet. The screws may then be inserted into eyelets of the strap(s). The screws may then be tightened to secure the strap(s), and the strap(s) may then be wrapped over the power adapter and tightened. The strap(s) may include hook and loop fasteners for adjustment and tightening.

The outlets 24 may be advantageously spaced-apart and/or oriented in opposing directions to address "wall warts" associated with power supplies, thereby allowing each and every outlet to be used.

A power cable 34 connects the power conditioner 10 to a main power supply, such as a wall outlet. In some embodiments, the power cable 34 has increased flexibility over conventional power cables for more efficient cable management and reduced frustration when installing in a cabinet or rack. In various embodiments, the power cable 34 is between about 6 feet to about 15 feet. In some embodiments, a power cable connector (not shown) is gold plated to resist corrosion and minimize loss. The power conditioner 10 includes a locking clip 36 to prevent accidental removal of the power cable 34. As shown by the arrow in FIG. 5, the locking clip 36 may be pivoted upward to allow connection or removal of the power cable 34, and the locking clip 36 may be pivoted downward to lock a connected power cable 34 in place.

The power conditioner 10 is configured to provide surge protection. Surges can come from a variety of sources (e.g., fluctuations at the power company, catastrophic events such as lightning). Excess energy can damage equipment connected to the outlets 24 if not properly protected. A Joule rating is a measure of the ability of a surge protector to "clamp" this excess energy down to a safe level; the higher the rating, the more protection provided to the equipment. In various embodiments, the power conditioner 10 has a Joule rating of at least 4000 J, at least 5000 J and at least 6000 J. A surge protection indicator 52 (e.g., an LED) provides visual feedback of proper surge protection.

Surges can be associated with not only the power connections, but also telephone, coax and network connections. As such, the power conditioner 10 may include at least one coaxial cable input/output 38 and/or at least one RJ11 or RJ45 connector inputs/output 40. As illustrated, the power conditioner includes dual coaxial cable input/outputs and dual RJ11 or RJ45 connector inputs/outputs. In some embodiments, the RJ11 or RJ45 connector inputs/outputs 40 provide full protection on all eight pins for telephone and Ethernet applications. In some embodiments, 3 GHz coax connections are provided to not only protect against surge, but also deliver premium signal quality with less than 1 dB of attenuation. Pass-through voltage may be supported for satellite systems.

A 12V DC input/output 42 may be provided to allow triggering from a control system or other component. For example, with an A/V receiver connected to one of the "always on" outlets 26, the receiver's 12V trigger output may be fed back to the 12V DC input. In this regard, turning on the receiver will cause all other source components to turn on as well. The separate 12V trigger output is engaged after the last sequenced outlet turns on. This allows a control system to know that everything is powered up and/or provides a trigger to another power conditioner to turn on.

Improper system grounding can lead to audio hum, video scan bars and other undesirable artifacts. To alleviate these issues, the power conditioner 10 may include a common grounding lug 44 for system components using ground leads, such as cable/satellite splitters. A ground indicator 46 (e.g., an LED) may be provided for visual feedback of proper grounding.

A safe voltage switch 54 may be employed to enable and disable a Safe Voltage feature, which protects equipment by automatically disconnecting the equipment during sustained under and over voltage conditions. When the input voltage returns to a safe level, the equipment will be reconnected automatically. A safe voltage indicator 56 (e.g., an LED) may be provided to indicate that the safe voltage feature is enabled and/or that input voltage is at a safe level.

The illustrated power conditioner 10 also includes an AC power switch 58 as well as a circuit breaker 59. In some embodiments, the circuit breaker 59 is a 15 amp resettable circuit breaker.

Figure 4:
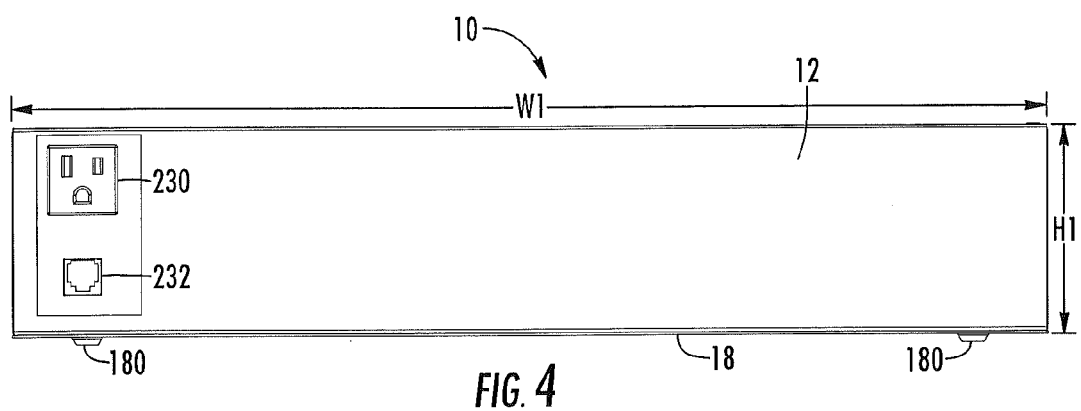
FIG. 4 is a front view of the power conditioner of FIG. 1.
Figure 5:
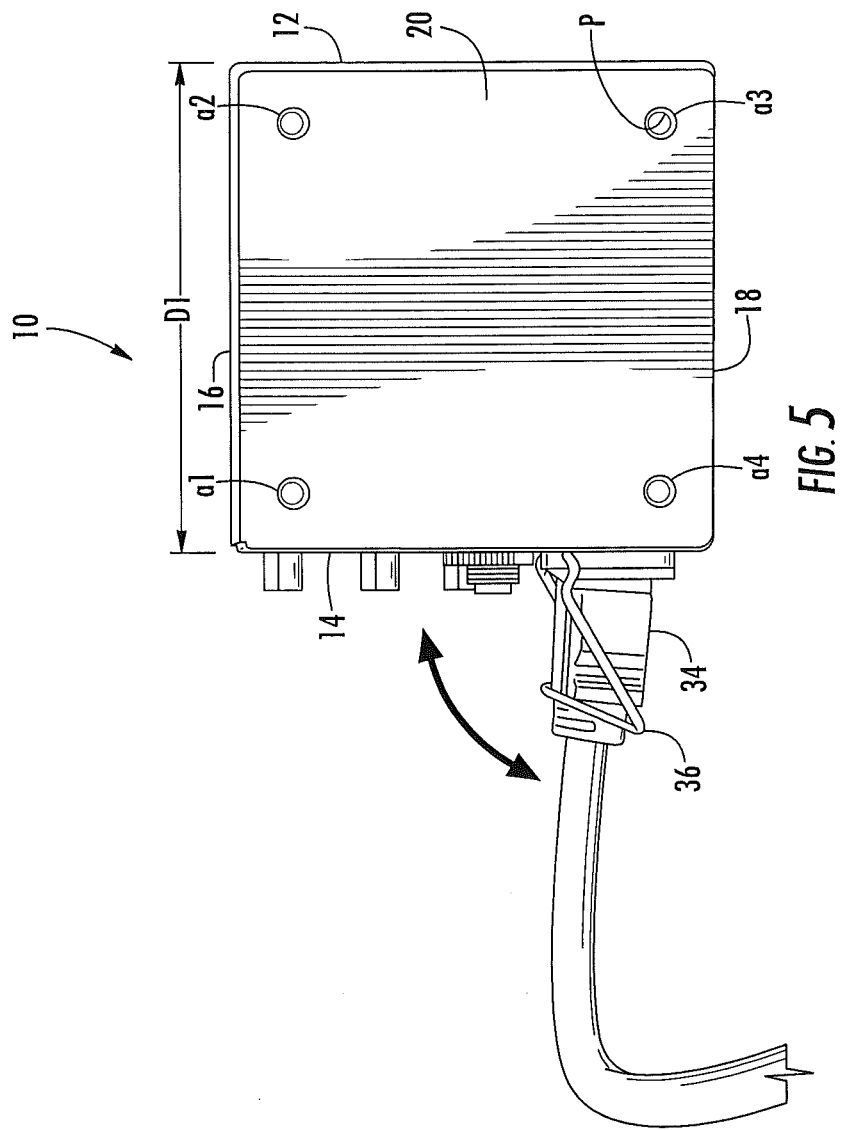
FIG. 5 is a side view of the power conditioner of FIG. 1.

Referring now to FIG. 5, each side panel 20, 22 includes four apertures: a first aperture a1, a second aperture a2, a third aperture a3 and a fourth aperture a4 (only the side panel 20 is shown in FIG. 4). As illustrated, the aperture a1 is located proximate the rear panel 14 and the top panel 16, the aperture a2 is located proximate the front panel 12 and the top panel 16, the aperture a3 is located proximate the front panel 12 and the bottom panel 18, and the aperture a4 is located proximate the rear panel 14 and the bottom panel 18. Also as illustrated, the apertures a1-a4 define a square.

Figure 6:
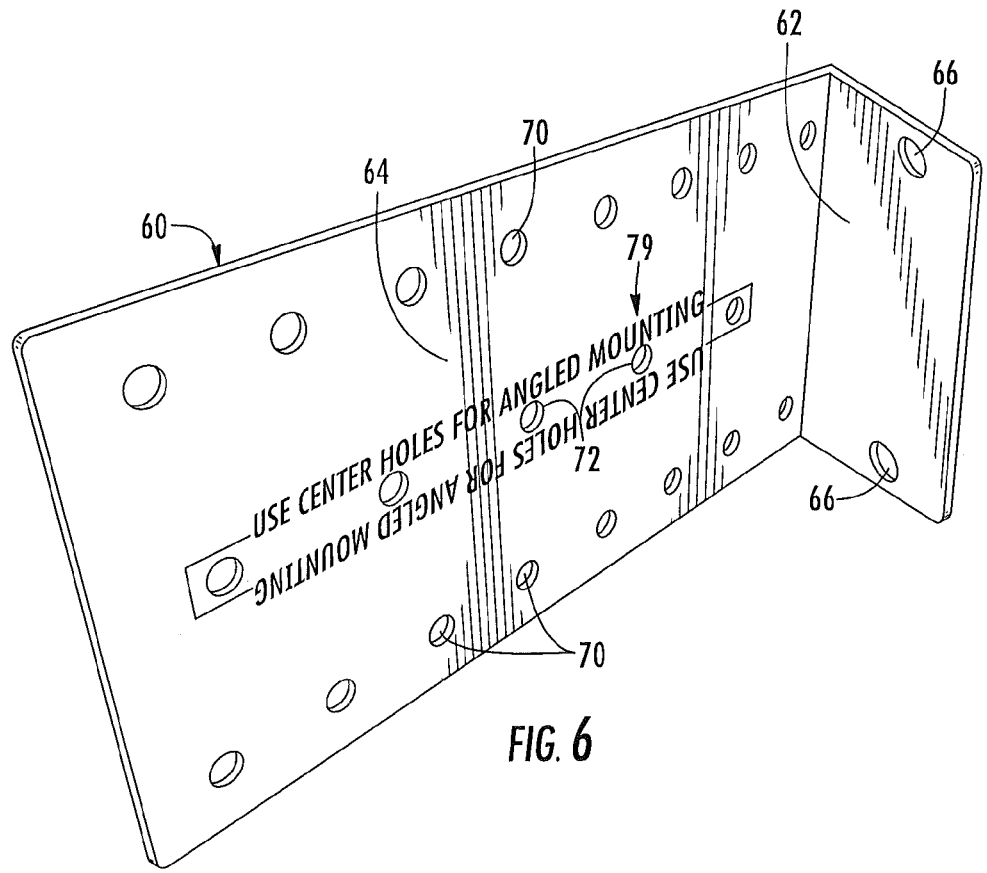
FIG. 6 is a perspective view of a bracket for use with the power conditioner of FIG. 1 according to some embodiments.
Figure 7:
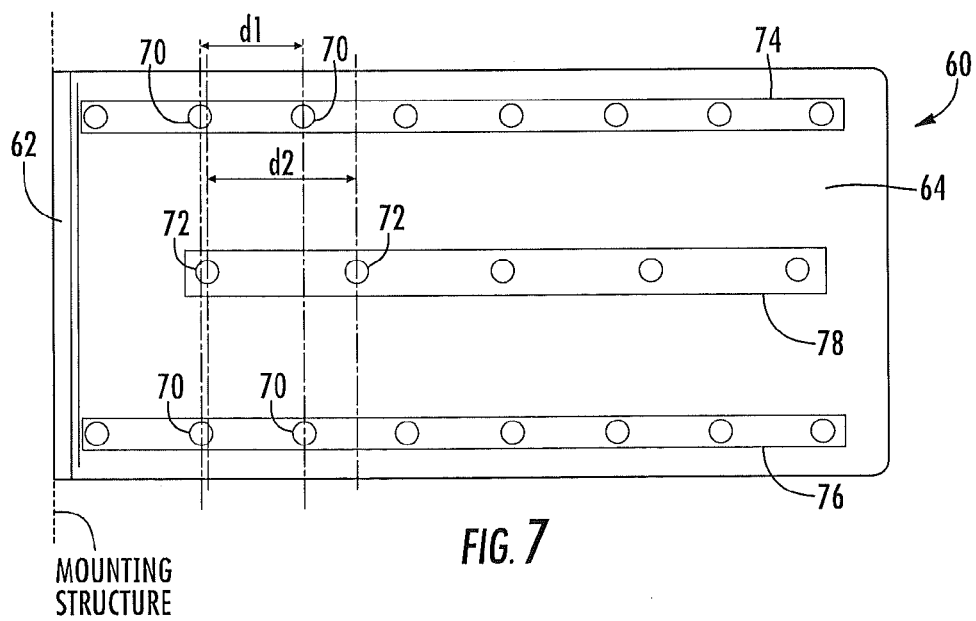
FIG. 7 is a plan view of the bracket of FIG. 6.

The power conditioner 10 may be mounted to a mounting structure such as an equipment rack via brackets 60 (FIGS. 6 and 7). Each bracket 60 includes a rear portion 62 and a front portion 64. The rear portion 62 is adapted to connect to the rear of the mounting structure, as described in more detail below. As illustrated, the rear portion 62 includes a pair of apertures 66 for attachment or connection to the rear of the mounting structure. It will be appreciated that the bracket 60 may be attached or connected to the rear of the mounting structure in other ways. For example, one or more passageways or slots may take the place of the apertures 66. Alternatively, the bracket 60 may fit within a slot or the like of the mounting structure, or the bracket 60 may be adhered to the mounting structure or integrated with the mounting structure. Further, it is contemplated that the bracket rear portion that attaches/connects to the rack is coplanar or substantially coplanar with the bracket front portion (i.e., the bracket is flat or substantially flat).

The bracket front portion 64 includes a plurality of apertures 70, 72. When attached to the mounting structure, a top row 74 of a plurality of spaced-apart apertures 70, a bottom row 76 of a plurality of spaced-apart apertures 70 and a middle row 78 of a plurality of spaced-apart apertures 72 are defined. In the illustrated embodiment, each of the top row 74 and bottom row 76 includes eight apertures 70 and the middle row 78 includes five apertures 72. It will be appreciated that one or more of the top, bottom and middle rows 74, 76, 78 may have a fewer or greater number of apertures than as illustrated.

As shown in FIG. 7, adjacent apertures 70 of the top row 74 and adjacent apertures 70 of the bottom row 76 are spaced apart a distance d1. Adjacent apertures 72 of the middle row 78 are spaced apart a distance d2 that is greater than the distance d1. In some embodiments, the distance d1 is about 0.825 inches and the distance d2 is about 1.15 inches.

Figure 8:
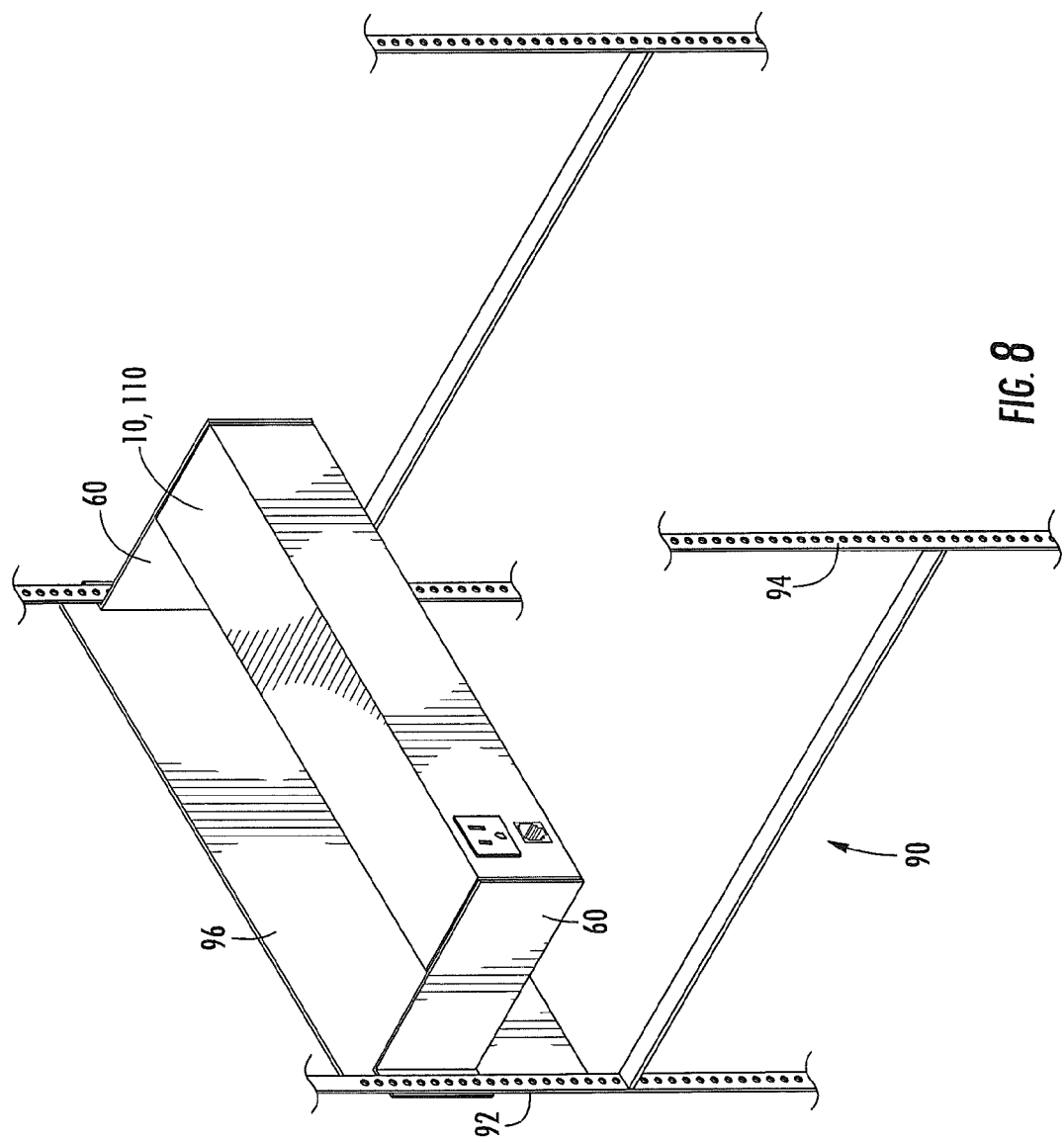
FIG. 8 is a perspective view of a portion of an equipment rack with the power conditioner of FIG. 1 mounted thereto.

The power conditioner 10 is configured to be mounted at or near the rear of a mounting structure, such as an equipment rack. As illustrated in FIG. 8, a rack 90 includes a pair of spaced-apart rear rails 92 and a pair of spaced-apart front rails 94. A bracket 60 is attached or connected to each of the rear rails 92, and the power conditioner 10 is mounted to the brackets 60 at a rear portion of the rack 90. The rear rails 92 define a rear vertical plane 96 extending therebetween. The brackets are identical or substantially identical such that one bracket 60 is mounted to one of the rear rails 92 and another bracket 60 is rotated 180 degrees and mounted to the other one of the rear rails 92. As will be described in more detail below, the power conditioner 10 is configured to be mounted to the brackets 60 in a plurality of different manners such that the power conditioner is mounted in a plurality of different orientations relative to the rear vertical plane 96 and, more generally, relative to the rack 90.

Figure 9:
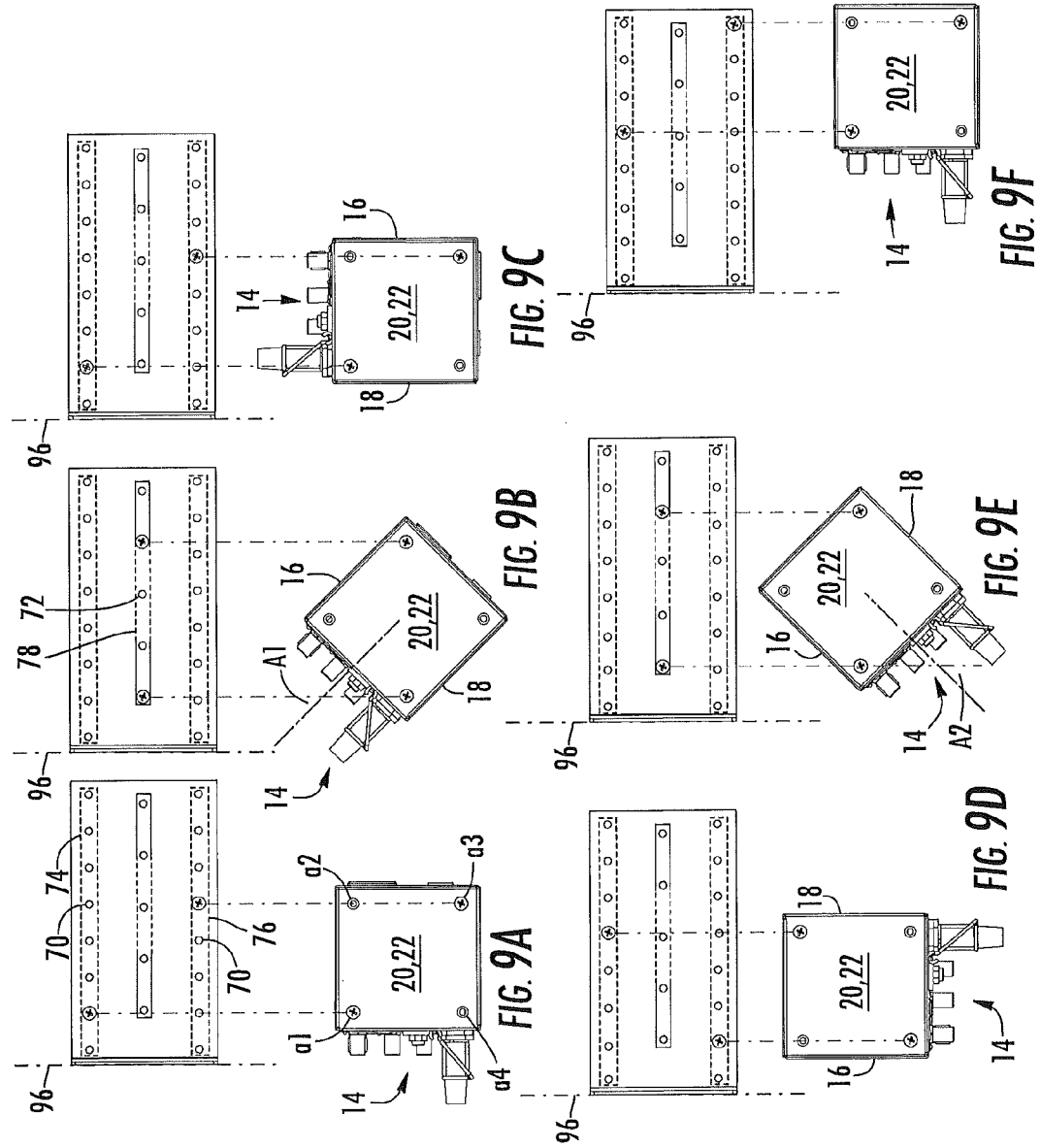
FIGS. 9A-9F illustrate various mounting orientations using the bracket of FIG. 6 for the power conditioner of FIG. 1.

As shown in FIG. 9A, the power conditioner 10 is mountable in a rearward orientation wherein the rear panel 14 is parallel to or substantially parallel to the rear vertical plane 96. In the rearward orientation, one of the apertures a1-a4 of each power conditioner side panel 20, 22 is aligned with one of the apertures 70 of one of the top and bottom rows 74, 76 of a respective bracket 60 and another one of the apertures a1-a4 is aligned with one of the apertures 70 of the other one of the top and bottom rows 74, 76 of the respective bracket 60. In some embodiments, in the rearward orientation, two of the apertures a1-a4 of each power conditioner side panel 20, 22 are aligned with two of the apertures 70 of one of the top and bottom rows 74, 76 of a respective bracket 60 and the other two of the apertures a1-a4 are aligned with two of the apertures 70 of the other one of the top and bottom rows 74, 76 of the respective bracket 60.

The power conditioner 10 is also mountable in at least one angled orientation, as exemplified in FIGS. 9B and 9E, wherein the rear panel 14 is at an oblique angle A1, A2 to the rear vertical plane 96. In the angled orientation(s), two of the apertures a1-a4 of each power conditioner side panel 20, 22 are aligned with two of the apertures 72 of the middle row 78 of a respective bracket 60.

In some embodiments, the power conditioner 10 is mountable in both an upward angled orientation (FIG. 9B) and a downward angled orientation (FIG. 9E). In the upward angled orientation, a majority of the of the power conditioner top panel 16 is positioned further away from the rear vertical plane 96 than is a majority of the power conditioner bottom panel 18. Conversely, in the downward angled orientation, a majority of the of the power conditioner bottom panel 18 is positioned further away from the rear vertical plane 96 than is a majority of the power conditioner top panel 16.

According to some embodiments, in the upward angled orientation, two of the apertures a1-a4 of each power conditioner side panel 20, 22 are aligned with two of the apertures 72 of the middle row 78 of a respective bracket 60 and, in the downward angled orientation, the other two of the apertures a1-a4 of each power conditioner side panel 20, 22 are aligned with two of the apertures 72 of the middle row 78 of a respective bracket 60.

In some embodiments, the oblique angles A1, A2 are equal or substantially equal. In some embodiments, the angles A1, A2 are each about 45 degrees.

As illustrated in FIG. 6, the brackets 60 may be provided with indicia 79 adjacent the middle row 78 to prompt an installer to use the middle row of apertures 72 to mount the power conditioner 10 in an angled orientation.

The power conditioner 10 may be mountable in still further orientations. Referring to FIG. 9C, the power conditioner 10 may be mountable in an upward orientation, wherein the rear panel 14 is perpendicular to or substantially perpendicular to the rear vertical plane 96 and the top panel 16 is positioned further away from the rear vertical plane 96 than is the bottom panel 18 of the power conditioner. Referring to FIG. 9D, the power conditioner 10 may be mountable in a downward orientation, wherein the rear panel 14 is perpendicular to or substantially perpendicular to the rear vertical plane 96 and the bottom panel 18 is positioned further away from the rear vertical plane 96 than is the top panel 16 of the power conditioner.

According to some embodiments, in each of the upward and downward orientations, one of the apertures a1-a4 of each power conditioner side panel 20, 22 is aligned with one of the apertures 70 of one of the top and bottom rows 74, 76 of a respective bracket 60 and another one of the apertures a1-a4 of the power conditioner side panel 20, 22 is aligned with one of the apertures 70 of the other one of the top and bottom rows 74, 76 of the respective bracket 60. According to some embodiments, in each of the upward and downward orientations, two of the apertures a1-a4 of each power conditioner side panel 20, 22 are aligned with two of the apertures 70 of one of the top and bottom rows 74, 76 of a respective bracket 60 and the other two of the apertures a1-a4 of the power conditioner side panel 20, 22 are aligned with two of the apertures 70 of the other one of the top and bottom rows 74, 76 of the respective bracket 60.

The power conditioner 10 may be mounted in a non-recessed orientation and at least one recessed orientation. In the non-recessed orientation, a pair of the apertures a1-a4 of the first and second side panels 20, 22 is aligned with a first aperture and a second aperture of a respective bracket 60. In the recessed orientation, the pair of the apertures a1-a4 of each side panel 20, 22 is aligned with a third aperture that is located a greater distance from the bracket rear portion 62 and/or the rear vertical plane 96 than is the first aperture and with a fourth aperture that is located a greater distance from the bracket rear portion 62 and/or the rear vertical plane 96 than is the second aperture. An exemplary recessed orientation is the rearward recessed orientation shown in FIG. 9F.

It will be appreciated that the power conditioner 10 may be mounted in at least one downward recessed orientation, at least one upward recessed orientation, and at least one angled recessed orientation. It will also be appreciated that the power conditioner 10 may be mounted in a plurality of recessed orientations. For example, referring to FIG. 9A, the apertures a1, a4 may be aligned with the apertures 70 that are closest to the bracket rear portion 62 and/or the rear vertical plane 96. The apertures a2, a3 may be aligned with the fourth apertures 70 moving away from the bracket rear portion 62 and/or the rear vertical plane 96. This may be referred to as a "flush" orientation in that the power conditioner rear panel 14 is flush or substantially flush with the rear of the rack or the rear vertical plane 96. As the top and bottom rows 74, 76 each include eight apertures in the illustrated embodiment, the power conditioner may be mounted in four recessed rearward orientations, with the first recessed rearward orientation as shown in FIG. 9A. It will be appreciated that the power conditioner may also be mounted in a "flush" upward and downward orientation in a similar manner, and the power conditioner may also be mounted in a plurality of recessed upward and downward orientations by aligning at least some of apertures a1-a4 with apertures 70 that are progressively further from the bracket rear portion 62 and/or the rear vertical plane 96.

Similarly, the power conditioner 10 may be mounted in at least one recessed upward angled orientation and at least one recessed downward angled orientation. An exemplary non-recessed upward angled orientation is illustrated in FIG. 9B and an exemplary non-recessed downward angled orientation is illustrated in FIG. 9E. It will be appreciated from the above discussion that two of the apertures a1-a4 may be aligned with apertures 72 of the middle row 78 that are further away from the bracket rear portion 62 and/or the rear vertical plane 96 such that the power conditioner 10 assumes one or more recessed angled orientations.

The apertures of the brackets 60 and the power conditioner side panels 20, 22 may each be configured to receive a fastener therethrough to attach or mount the power conditioner 10 to the brackets 60. Referring back to FIG. 5, each power conditioner side panel 20, 22 includes a plurality of passageways p, with each passageway p extending inwardly from a respective aperture a1-a4. In some embodiments, at least a portion of each passageway p is threaded such that the passageway may receive a threaded fastener therein.

Figure 10:
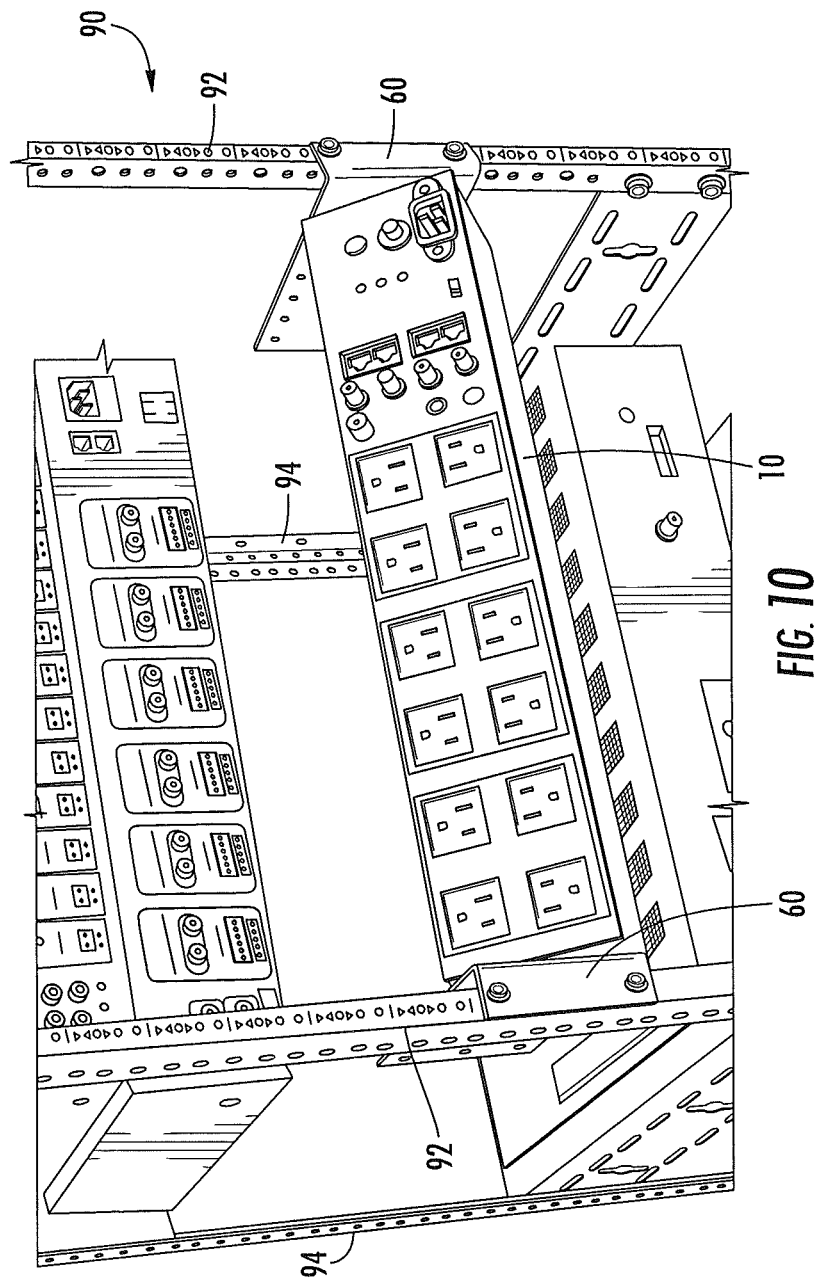
FIG. 10 illustrates the power conditioner of FIG. 1 mounted to an equipment rack in an exemplary upward angled orientation.
Figure 11:
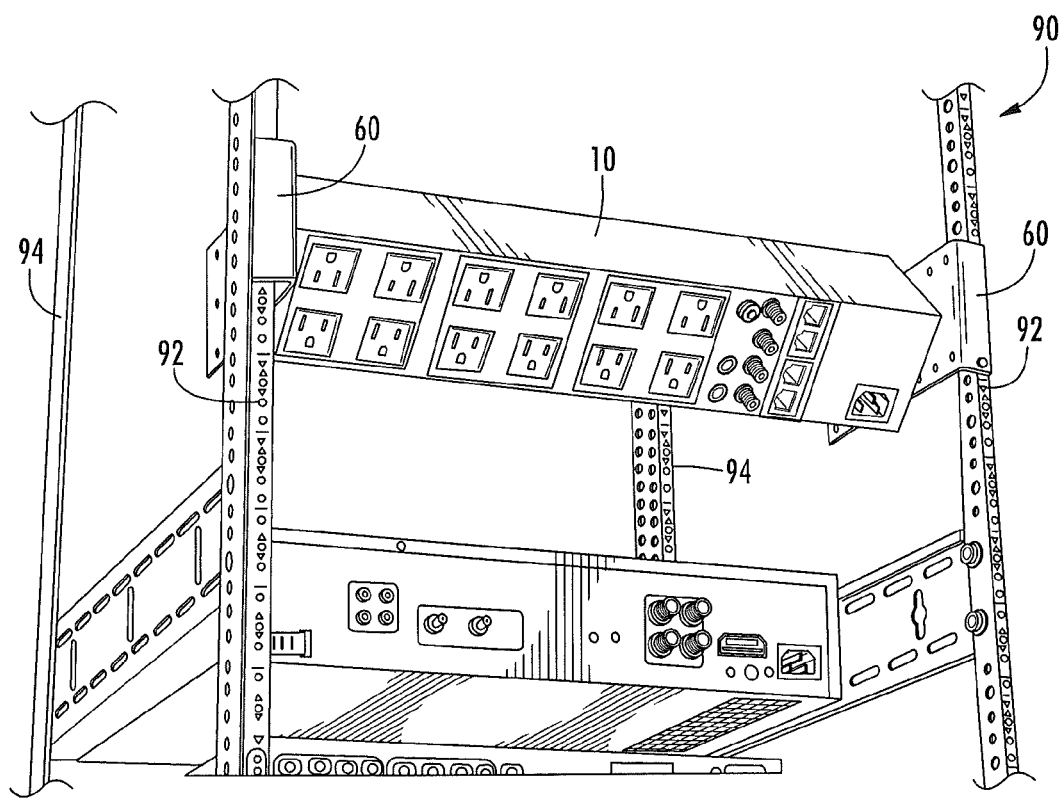
FIG. 11 illustrates the power conditioner of FIG. 1 mounted to an equipment rack in an exemplary downward angled orientation.

The power conditioner 10 is shown mounted to a rack 90 in FIGS. 10 and 11. More particularly, the brackets 60 are mounted to the rear rails 92 of the rack 90. It will be apparent that, once the brackets 60 are mounted to the rear rails 92, the installer may position the power conditioner 10 in the desired orientation by aligning apertures of side panels of the power conditioner 10 with apertures of the brackets 60. The installer may then mount the power conditioner 10 to the brackets 60 in the desired orientation by applying fasteners through the aligned apertures. This may be done from outside the rack 90 (i.e., to the sides of the rack 90).

The power conditioner 10 is shown mounted in an exemplary upward angled orientation in FIG. 10. Such an orientation may be advantageous when the power conditioner is mounted near the bottom of the rack and/or when equipment is situated above the power conditioner. An upward orientation as described above may also be advantageous in these situations.

The power conditioner 10 is shown mounted in an exemplary downward angled orientation in FIG. 11. Such an orientation may be advantageous when the power conditioner is mounted near the top of the rack and/or when equipment is situated below the power conditioner. A downward orientation as described above may also be advantageous in these situations.

The orientations shown in FIGS. 10 and 11 exemplify just a few of many different orientations that can be employed as needed based on the position of the power conditioner, the position of other equipment in the rack, and many other factors, such as the proximity of a wall or a cabinet panel to the rear of the rack. For example, the power conditioner may be recessed as described above to provide clearance between the panel/wall so as to increase accessibility to the power conditioner outlets and/or provide space for improved cable management. The power conditioner may be mounted in a rearward recessed orientation when the power conditioner is positioned near the middle of the rack with equipment positioned above and below the power conditioner. Such an orientation may provide improved accessibility to the power conditioner outlets from above and below. It will be appreciated that the power conditioner may be mounted in a plurality of different advantageous orientations based on environment and/or user preference.

The power conditioner 10 has a relatively small form factor. According to some embodiments, the power conditioner has a height H1 (FIG. 4) of about 3.5 inches (i.e., about 2 rack units or 2 U), a depth D1 (FIG. 5) of about 3.5 inches and a width W1 (FIG. 4) of about 17 inches. In some other embodiments, the height H1 may be less than about 3.5 inches, the depth D1 may be less than about 3.5 inches and/or the width W1 may be less than about 17 inches. At least the height and width may be selected such that the power conditioner may be accommodated in racks of various dimensions, including those of standard dimensions. The small form factor allows for the power conditioner 10 to be mounted in a variety of orientations with the outlets near the rear of the rack, where they are most frequently needed. Also, the relatively small depth allows the power conditioner to extend only a minor portion of the distance from the rear rails 92 to the front rails 94 of the rack 90. Not only does this allow the power conditioner 10 to be easily manipulated, oriented and mounted, but it also opens up valuable space in the rack. This space may be used to house other equipment, or may be useful for wire management and/or ventilation purposes.

Figure 12:
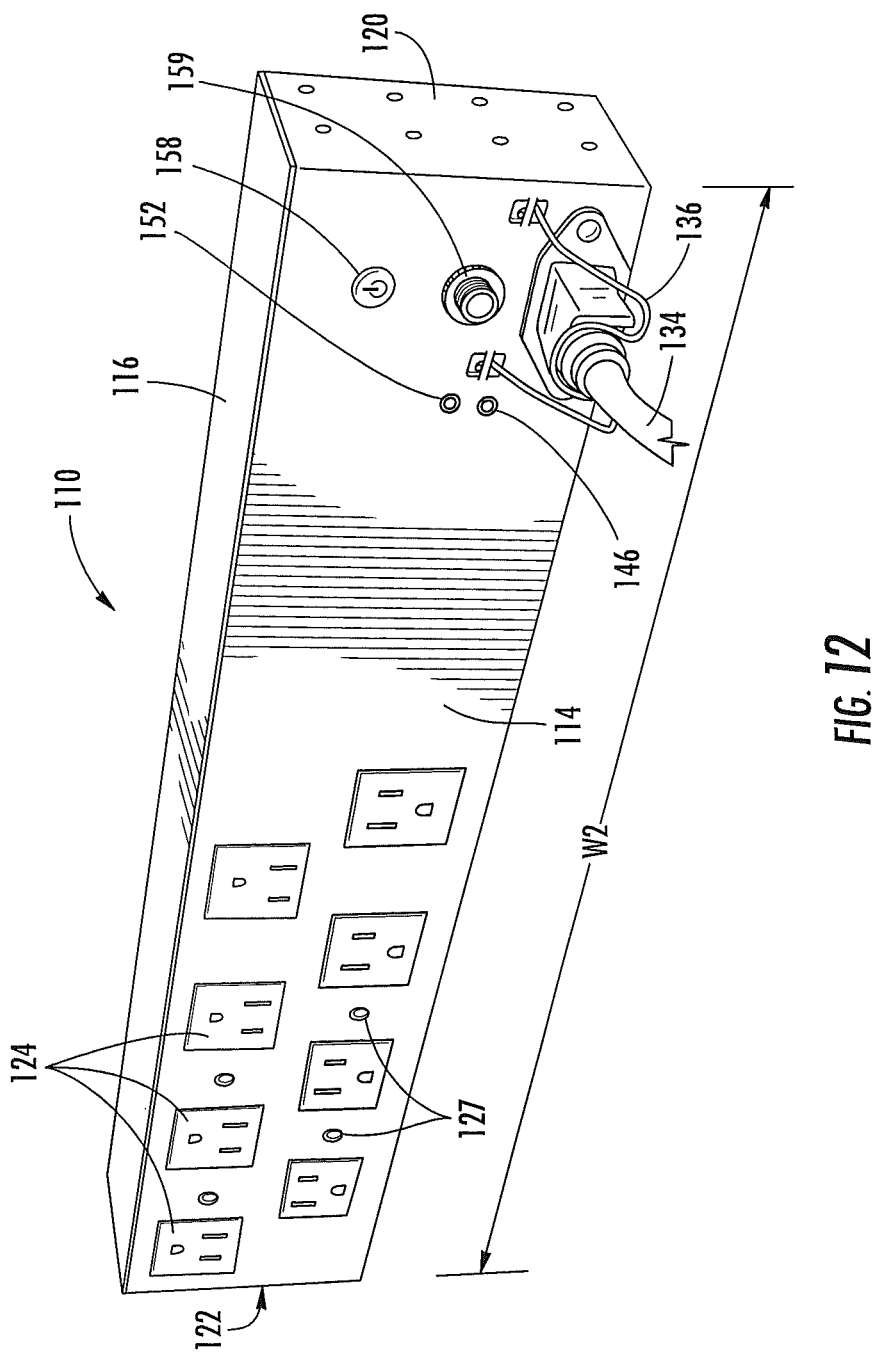
FIG. 12 is a rear perspective view a power conditioner according to some embodiments.
Figure 13:
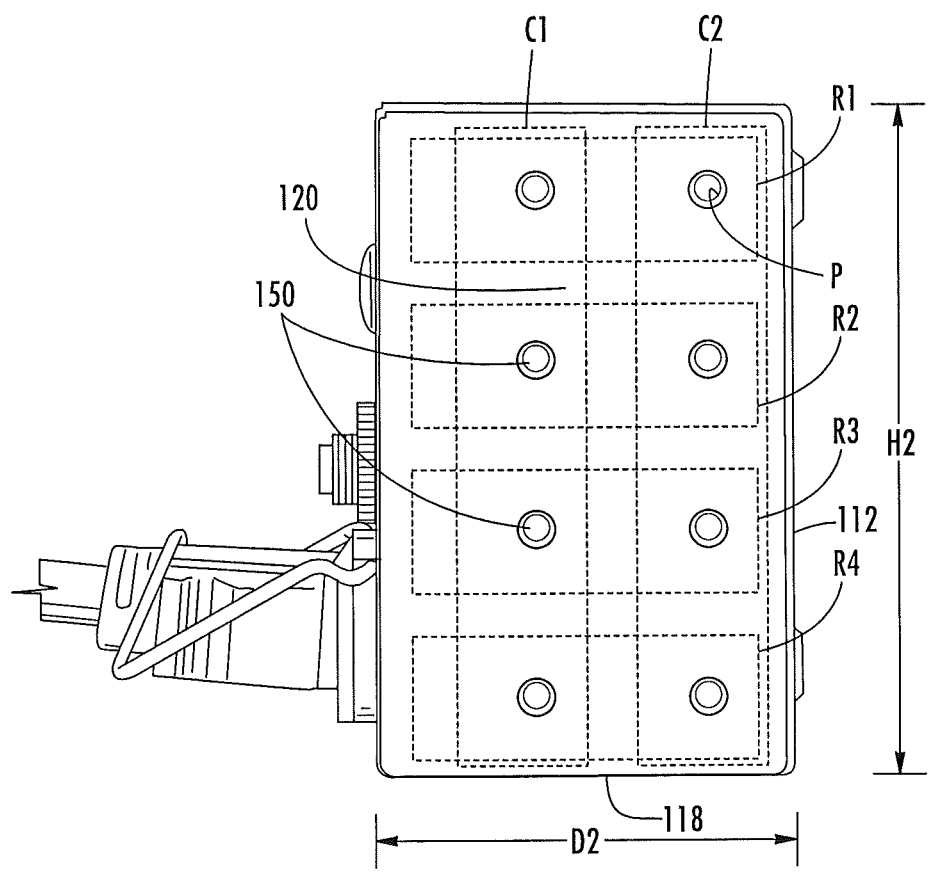
FIG. 13 is a side view of the power conditioner of FIG. 12.

A power conditioner 110 according to some other embodiments is illustrated in FIGS. 12 and 13. The power conditioner 110 shares some, but not all, of the same features of the power conditioner 10 described above. It will be understood that various features of the power conditioners 10, 110 may be combined or omitted.

The power conditioner 110 includes a housing having a front panel 112, a rear panel 114, a top panel 116, a bottom panel 118, a first side panel 120, and a second, opposed side panel 122.

The rear panel 114 includes a plurality of outlets 124 for connecting components or equipment. In the illustrated embodiment, the rear panel 114 includes eight outlets, although a lesser or greater number of outlets is contemplated. The outlets 124 may be EMI/RFI filtered.

Attachment members 127 are positioned adjacent at least some of the outlets 24. The attachment members 127 are the same or substantially the same as the attachment members 27 described above and shown in FIG. 3. The attachment members may engage straps to tighten power adapters in place as described above in connection with the power conditioner 10.

The outlets 24 may be advantageously spaced-apart and/or orientated in opposing directions to address "wall warts" associated with power supplies, thereby allowing each and every outlet to be used.

A power cable 134 connects the power conditioner 110 to a main power supply, such as to a wall outlet. In some embodiments, the power cable 134 has increased flexibility over conventional power cables for more efficient cable management and reduced frustration when installing in a cabinet or rack. In various embodiments, the power cable 134 is between about 6 feet to about 15 feet. In some embodiments, power cable connector (not shown) is gold plated to resist corrosion and minimize loss. The power conditioner 110 includes a locking clip 136 to prevent accidental removal of the power cable 134. The locking clip 136 operates in the same way as the locking clip 36 described above in connection with the power conditioner 10.

The power conditioner 110 is configured to provide surge protection. In some embodiments, the power conditioner has a Joule rating of at least 3000 J. A surge protection indicator 152 (e.g., an LED) provides visual feedback of proper surge protection.

Improper system grounding can lead to audio hum, video scan bars and other undesirable artifacts. A ground indicator 146 (e.g., an LED) may also be provided for visual feedback of proper grounding.

The illustrated power conditioner 110 also includes an AC power switch 158 as well as a circuit breaker 159. In some embodiments, the circuit breaker 159 is a 15 amp resettable circuit breaker.

Referring now to FIG. 13, each side panel 120, 122 includes a plurality of apertures 150 (only the side panel 120 is shown in FIG. 13). As illustrated, the apertures 150 are arranged in a first column C1 located nearer the rear panel 114 than the front panel 112 and a second column C2 located nearer the front panel 112 than the rear panel 114. The apertures 150 are also arranged in four rows R1-R4. R1 may be referred to as the top row, R2 as the top middle row and R3 as the bottom middle row (collectively the "middle rows"), and R4 as the bottom row. As illustrated, each column C1, C2 includes four apertures 150 and each row R1, R2 includes two apertures 150. A greater or lesser number of columns, rows, or apertures associated therewith are contemplated.

Like the power conditioner 10, the power conditioner 110 may be mounted to a mounting structure (e.g., an equipment rack) via the brackets 60 illustrated in FIGS. 6 and 7. As illustrated in FIG. 8, a bracket 60 is attached or connected to each of the rear rails 92, and the power conditioner 110 is mounted to the brackets 60 at a rear portion of the rack 90. The rear rails 92 define a rear vertical plane 96 extending therebetween. Like the power conditioner 10, the power conditioner 110 is configured to be mounted to the brackets 60 in a plurality of different manners such that is power conditioner is mounted in a plurality of orientations relative to the rear vertical plane 96 and, more generally, relative to the rack 90.

Figure 14A:
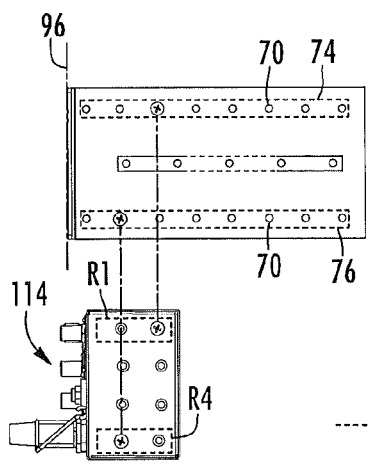
FIGS. 14A-14F illustrate various mounting orientations using the bracket of FIG. 6 for the power conditioner of FIG. 12.

As shown in FIG. 14A, the power conditioner 110 is mountable in a rearward orientation wherein the rear panel 114 is parallel to or substantially parallel to the rear vertical plane 96. In the rearward orientation, at least one of the apertures of the top row R1 of each power conditioner side panel 120, 122 is aligned with at least one of the apertures 70 of one of the top and bottom rows 74, 76 of a respective bracket 60 and at least one of the apertures of the bottom row R4 is aligned with at least one of the apertures 70 of the other one of the top and bottom rows 74, 76 of the respective bracket 60. In some embodiments, in the rearward orientation, each of the apertures of the top row R1 of each power conditioner side panel 120, 122 is aligned with one of the apertures 70 of one of the top and bottom rows 74, 76 of a respective bracket 60 and each of the apertures of the bottom row R4 is aligned with one of the apertures 70 of the other one of the top and bottom rows 74, 76 of the respective bracket 60.

Figure 14B:
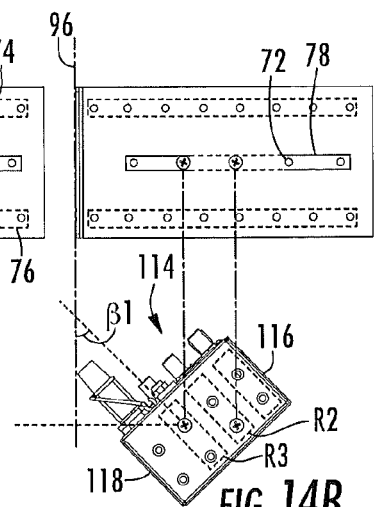
Figure 14C:
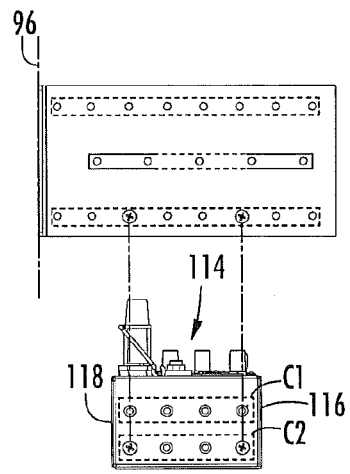
Figure 14D:
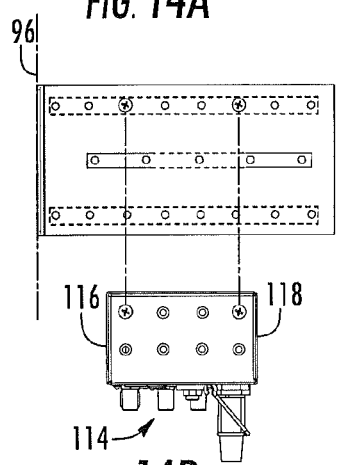
Figure 14E:
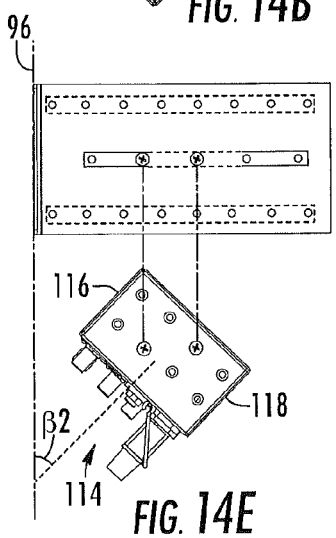

The power conditioner 110 is also mountable in at least one angled orientation, as exemplified in FIGS. 14B and 14E, wherein the rear panel 114 is at an oblique angle B1, B2 to the rear vertical plane 96. In the angled orientation(s), one aperture of each of the middle rows R2 and R3 of each power conditioner side panel 120, 122 is aligned with an aperture 72 of the middle row 78 of a respective bracket 60.

In some embodiments, the power conditioner 110 is mountable in both an upward angled orientation (FIG. 14B) and a downward angled orientation (FIG. 14E). In the upward angled orientation, the power conditioner top panel 116 is positioned further away from the rear vertical plane 96 than is the power conditioner bottom panel 118. Conversely, in the downward angled orientation, the of the power conditioner bottom panel 118 is positioned further away from the rear vertical plane 96 than is the power conditioner top panel 116.

According to some embodiments, in the upward angled orientation, a first one of the apertures of each of the middle rows R2, R3 of each power conditioner side panel 120, 122 are aligned with two of the apertures 72 of the middle row 78 of a respective bracket 60 and, in the downward angled orientation, a different one of the apertures of each of the middle rows R2, R3 of each power conditioner side panel 120, 122 are aligned with two of the apertures 72 of the middle row 78 of a respective bracket 60.

In some embodiments, the oblique angles B1, B2 are equal or substantially equal. In some embodiments, the angles B1, B2 are each about 45 degrees.

The power conditioner 110 may be mountable in still further orientations. Referring to FIG. 14C, the power conditioner 110 may be mountable in an upward orientation, wherein the rear panel 114 is perpendicular to or substantially perpendicular to the rear vertical plane 96 and the top panel 116 is positioned further away from the rear vertical plane 96 than is the bottom panel 118 of the power conditioner. Referring to FIG. 14D, the power conditioner 110 may be mountable in a downward orientation, wherein the rear panel 114 is perpendicular to or substantially perpendicular to the rear vertical plane 96 and the bottom panel 118 is positioned further away from the rear vertical plane 96 than is the top panel 116 of the power conditioner.

As illustrated in FIG. 14C, in the upward orientation, at least two of the apertures of the second column C2 of each of the power conditioner side panels 120, 122 are aligned with at least two of the apertures 70 of the bottom row 76 of a respective bracket 60. It will be appreciated that other configurations are possible to achieve the upward orientation. For example, at least two of the apertures of the first column C1 of each of the power conditioner side panels 120, 122 may be aligned with at least two of the apertures 70 of the top row 74 of a respective bracket 60.

As illustrated in FIG. 14D, in the downward orientation, at least two of the apertures of the second column C2 of each of the power conditioner side panels 120, 122 are aligned with at least two of the apertures 70 of the top row 74 of a respective bracket 60. It will be appreciated that other configurations are possible to achieve the downward orientation. For example, at least two of the apertures of the first column C1 of each of the power conditioner side panels 120, 122 may be aligned with at least two of the apertures 70 of the bottom row 76 of a respective bracket 60.

Figure 14F:
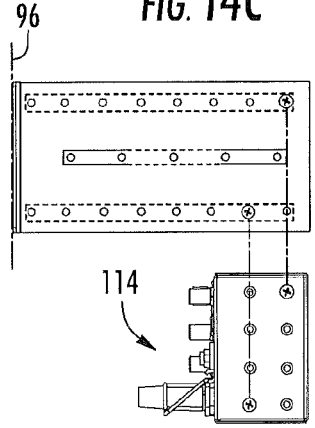

Like the power conditioner 10, the power conditioner 110 may be mounted in a non-recessed orientation and at least one recessed orientation. In the non-recessed orientation, a pair of the apertures of each of the first and second side panels 120, 122 is aligned with a first aperture and a second aperture of a respective bracket 60. In the recessed orientation, the pair of the apertures of each side panel 120, 122 is aligned with a third aperture that is located a greater distance from the bracket rear portion 62 and/or the rear vertical plane 96 than is the first aperture and with a fourth aperture that is located a greater distance from the bracket rear portion 62 and/or the rear vertical plane 96 than is the second aperture. An exemplary recessed orientation is the rearward recessed orientation shown in FIG. 14F.

It will be appreciated that the power conditioner 110 may be mounted in at least one downward recessed orientation, at least one upward recessed orientation, and at least one angled recessed orientation. It will also be appreciated that the power conditioner 110 may be mounted in a plurality of recessed orientations. For example, referring to FIG. 14A, at least some of the apertures of the first column C1 may be aligned with the apertures 70 that are closest to the bracket rear portion 62 and/or the rear vertical plane 96. At least some of the apertures of the second column C2 may be aligned with the second apertures 70 moving away from the bracket rear portion 62 and/or the rear vertical plane 96. This may be referred to as a "flush" orientation in that the power conditioner rear panel 114 is flush or substantially flush with the rear of the rack or the rear vertical plane 96. As the top and bottom rows 74, 76 each include eight apertures in the illustrated embodiment, the power conditioner may be mounted in six recessed rearward orientations, with the first recessed rearward orientation as shown in FIG. 14A. It will be appreciated that the power conditioner may also be mounted in a "flush" upward and downward orientation in a similar manner, and the power conditioner may also be mounted in a plurality of recessed upward and downward orientations by aligning at least some of apertures of the power conditioner side panels 120, 122 with apertures 70 that are progressively further from the bracket rear portion 62 and/or the rear vertical plane 96.

Similarly, the power conditioner 110 may be mounted in at least one recessed upward angled orientation and at least one recessed downward angled orientation. As the middle row 78 of each bracket 60 includes five apertures in the illustrated embodiment, the power conditioner may be mounted in a non-recessed angled orientation and three recessed angled orientations. A first angled recessed orientation is exemplified in FIGS. 14B and 14E, and further angled recessed orientations may be realized by aligning the respective apertures of the power conditioner side panels 120, 122 with apertures 72 that are progressively further from the bracket rear portion 62 and/or the rear vertical plane 96.

The apertures of the brackets 60 and the power conditioner side panels 120, 122 may each be configured to receive a fastener therethrough to mount the power conditioner 110 to the brackets 60. Referring back to FIG. 13, each power conditioner side panel 120, 122 includes a plurality of passageways p, with each passageway p extending inwardly from a respective aperture 150. In some embodiments, at least a portion of each passageway p is threaded such that the passageway may receive a threaded fastener therein.

Like the power conditioner 10, the power conditioner 110 has a relatively small form factor. According to some embodiments, the power conditioner has a height H2 (FIG. 13) of about 3.5 inches (i.e., about 2 U or 2 rack units), a depth D2 (FIG. 13) of about 2.1 inches and a width W2 (FIG. 12) of about 17 inches. In some other embodiments, the height H2 may be less than about 3.5 inches, the depth D2 may be less than about 2.1 inches and/or the width W2 may be less than about 17 inches. At least the height and width may be selected such that the power conditioner may be accommodated in racks of various dimensions, including those of standard dimensions. The small form factor allows for the power conditioner 110 to be mounted in a variety of orientations with the outlets near the rear of the rack, where they are most frequently needed. Also, the power conditioner 110 extends only a minor portion of the distance from the rear rails 92 to the front rails 94 of the rack 90 (FIG. 8). Not only does this allow the power conditioner 110 to be easily manipulated, oriented and mounted, but it also opens up valuable space in the rack. This space may be used to house other equipment, or may be advantageous for wire management and/or ventilation purposes. Therefore, the power conditioner 110 may be used with the brackets 60 to realize the same advantages described above in reference to the power conditioner 10.

Figure 15A:
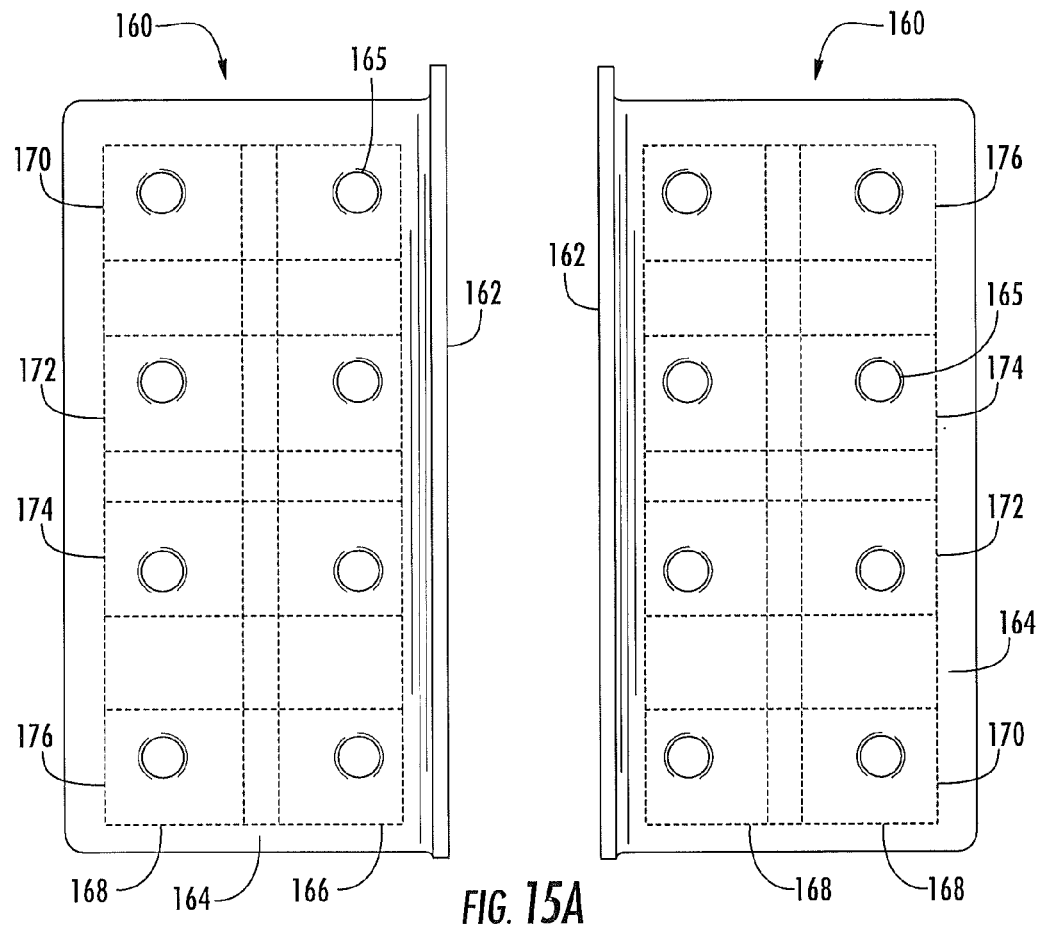
FIGS. 15A and 15B illustrate a bracket for use with the power conditioners of FIGS. 1 and 12 according to some embodiments.
Figure 15B:
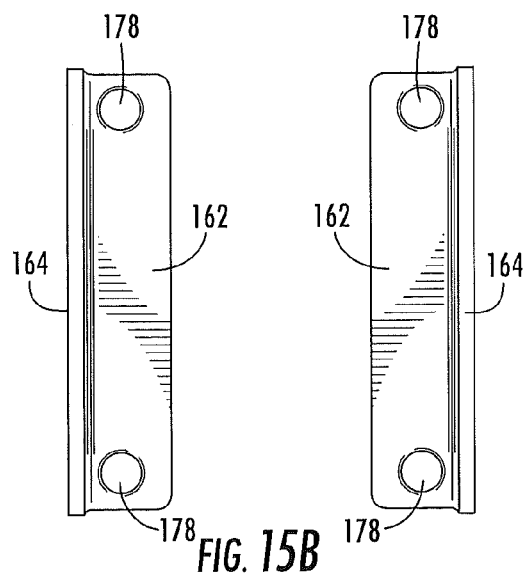

Turning to FIGS. 15A and 15B, a pair of brackets 160 may also be provided. Each bracket 160 includes a rear portion 162 and a substantially perpendicular front portion 164. The front portion 164 includes a plurality of apertures 165 and is adapted to attach or connect to the side panels of the power conditioners 10, 110, as described in more detail below. As illustrated, the bracket front portion 164 includes two columns 166, 168 of four apertures 165 and four rows 170, 172, 174, 176 of two apertures 165. A greater or lesser number of columns, rows, or apertures associated therewith are contemplated.

The bracket rear portion 162 includes a plurality of apertures 178. As illustrated, each bracket rear portion includes a pair of apertures 178.

The brackets 160 are configured to provide additional mounting options for the power conditioners 10, 110. For example, referring to FIGS. 16A and 16B, the power conditioner 10 may be mounted to the rear of an equipment rack (e.g., the equipment rack 90 shown in FIG. 8) using the brackets 160. Specifically, the rear portions 162 of the brackets 160 may be mounted to the rear rails 92 of the rack 90. In FIG. 16A, the power conditioner 10 is shown in a rearward orientation wherein the rear panel 14 is parallel or substantially parallel with the rear vertical plane 96 defined by the rear rails 92 (FIG. 8). As illustrated, the apertures a1 and a4 of each power conditioner side panel 20, 22 are each aligned with an aperture in the column 166 of a respective bracket 160. It is noted that the brackets 160 may provide for at least one recessed rearward orientation by aligning the apertures a1, a4 with two of the apertures in the column 168 of the bracket 160.

In FIG. 16B, the power conditioner 10 is shown in an upward orientation wherein the rear panel 16 is perpendicular or substantially perpendicular with the rear vertical plane 96. As illustrated, the apertures a3 and a4 of each power conditioner side panel 20, 22 are each aligned with an aperture of the column 166 of a respective bracket 160. It will be appreciated that the power conditioner may be mounted in a downward orientation by aligning the apertures a1 and a2 of each power conditioner side panel 20, 22 with apertures of the bracket columns 166. It will also be appreciated that the power conditioner may be mounted in upward and/or downward recessed orientations by aligning the appropriate apertures of each power conditioner side panel 20, 22 with apertures of the bracket columns 168.

Therefore, the brackets 160 provide for a plurality of mounting options or orientations at the rear of an equipment rack. The brackets 160 also allow the power conditioner to be mounted to a flat mounting surface (e.g., a wall or other vertical mounting surface or a horizontal surface or a sloped surface). The bracket rear portions 162 are mounted to the flat mounting surface using the apertures 178 and the power conditioner is mounted to the bracket front portions 164.

For example, the power conditioner 10 is shown mounted to a wall 196 in FIG. 16C. As illustrated, the power conditioner 10 is mounted in an upward configuration, with the apertures a1, a2 of each side panel 20, 22 aligned with apertures of the bracket columns 166. It will be appreciated that the power conditioner 10 may be mounted in an "outward" orientation, wherein the apertures a1, a3 of each side panel 20, 22 are aligned with apertures of the bracket columns 166. Such an outward orientation may be useful when the brackets 160 and the power conditioner 10 are mounted to a horizontal or sloped surface. It will also be appreciated that the power conditioner may be mounted in a downward orientation, wherein the apertures a3, a4 of each side panel 20, 22 are aligned with apertures of the bracket columns 166.

The brackets 160 may also be used to mount the power conditioner 110 to a variety of mounting structures/surfaces and in a variety of orientations. For example, referring to FIGS. 17A and 17B, the power conditioner 110 may be mounted to the rear of an equipment rack (e.g., the equipment rack 90 shown in FIG. 8) using the brackets 160. Specifically, the rear portions 162 of the brackets 160 may be mounted to the rear rails 92 of the rack 90. In FIG. 17A, the power conditioner 110 is shown in a rearward orientation wherein the rear panel 114 is parallel or substantially parallel with the rear vertical plane 96 defined by the rear rails 92 (FIG. 8). As illustrated, at least one aperture in the column C1 of each power conditioner side panel 120, 122 is aligned with at least one aperture of each of the bracket columns 166 and at least one aperture in the column C2 of each power conditioner side panel 120, 122 is aligned with at least one aperture of each of the bracket columns 168.

In FIG. 17B, the power conditioner 110 is shown in an upward orientation wherein the rear panel 114 is perpendicular or substantially perpendicular to the rear vertical plane 96. As illustrated, at least one aperture in the row R3 of each power conditioner side panel 120, 122 is aligned with at least one aperture of each of the bracket columns 168 and at least one aperture in the row R4 of each power conditioner side panel 120, 122 is aligned with at least one aperture of each of the bracket columns 166. It will be appreciated that the power conditioner may be mounted in a downward orientation by aligning apertures in the rows R1 and R2 with apertures in the columns 166 and 168, respectively. It will also be appreciated that the power conditioner 110 may be mounted in a plurality of vertical upward and downward orientations (i.e., by alignment with apertures of the rows 170-176).

The power conditioner 110 is shown mounted to a wall 196 in FIG. 17C. As illustrated, the power conditioner 10 is mounted in an "outward" orientation, with the apertures of column C1 aligned with apertures of the bracket columns 166 and the apertures of column C2 aligned with apertures of the bracket columns 168. It will be appreciated that the power conditioner may be mounted in an upward orientation, with apertures of the rows R1 and R2 aligned with apertures of the columns 166 and 168, respectively. It will also be appreciated that the power conditioner may be mounted in a downward orientation, with apertures of the rows R3 and R4 aligned with apertures of the columns 166 and 168, respectively.

As described above, the brackets 60 and 160 provide a plurality of mounting options for the power conditioners 10, 110. Accordingly, a kit may be provided including a pair of brackets 60 and a pair of brackets 160 to allow the installer to mount the power conditioner to a plurality of different mounting structures/surfaces and in a plurality of different orientations. The kit may also include a power conditioner 10 or 110, a plurality of fasteners (e.g., screws) to mount the power conditioner to the brackets via aligned apertures and/or a plurality of fasteners and associated components (e.g., screws, washers, anchors) to mount the brackets to the mounting structure or surface. Also, a plurality of rubber feet 180 (FIG. 4) may be provided. The rubber feet may be adhered or otherwise attached to the bottom panel 18, 118 of the power conditioners such that the power conditioner may rest on a flat or relatively flat surface (e.g., in a cabinet). Any other components described herein may also be included in a kit.

A faceplate 210 according to some embodiments is shown in FIGS. 18-22. The faceplate 210 includes a includes a housing having a front panel 212, a rear panel 214, a top panel 216, a bottom panel 218, a first side panel 220, and a second, opposed side panel 222. Each of the side panels includes a plurality of apertures 224, with a passageway p (e.g., a threaded passageway) extending inwardly from each of the apertures 224. As described in more detail below, the apertures 224 may be used to engage a bracket to mount the faceplate to a mounting structure.

Figure 18:
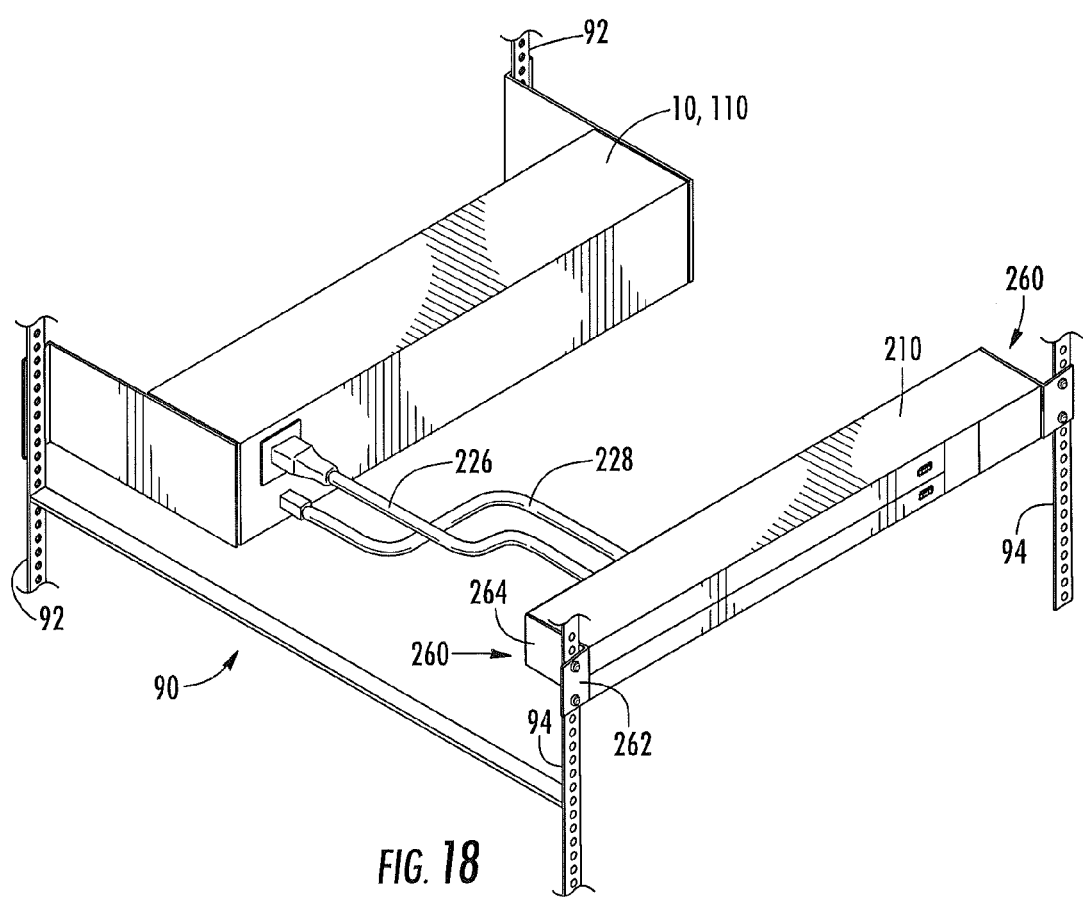
FIG. 18 is a perspective view of a portion of an equipment rack with a faceplate mounted thereto according to some embodiments.

As illustrated in FIG. 18, the power conditioner 10, 110 may be connected to the faceplate 210 via a power cord 226 and/or a display link cord 228 (e.g., an RJ45 cable or the like). Referring back to FIG. 4, the front panel 12 of the power conditioner 10 includes an outlet 230 configured to receive one end of the power cord 226. The rear panel 214 of the faceplate 210 includes an outlet 234 (FIG. 20) configured to receive the opposite end of the power cord 226, thereby providing power to the faceplate 210. The front panel 12 of the power conditioner 10 also includes a display link interface 232 configured to receive one end of the display link cord 228. The rear panel 214 of the faceplate 210 includes a display link interface 236 configured to receive the opposite end of the display link cord 228, thereby providing a data connection to the faceplate 210. Although not illustrated, the front panel 112 of the power conditioner 110 also includes an outlet 230 and a display link interface 232 for power and data connectivity with the faceplate 210.

Figure 19:
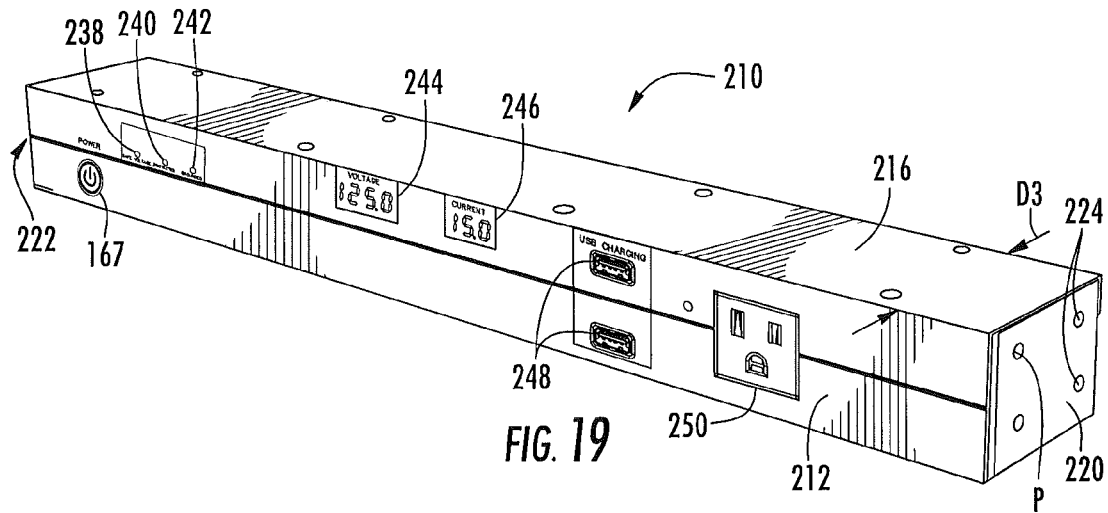
FIG. 19 is a front perspective view of the faceplate of FIG. 18.
Figure 20:
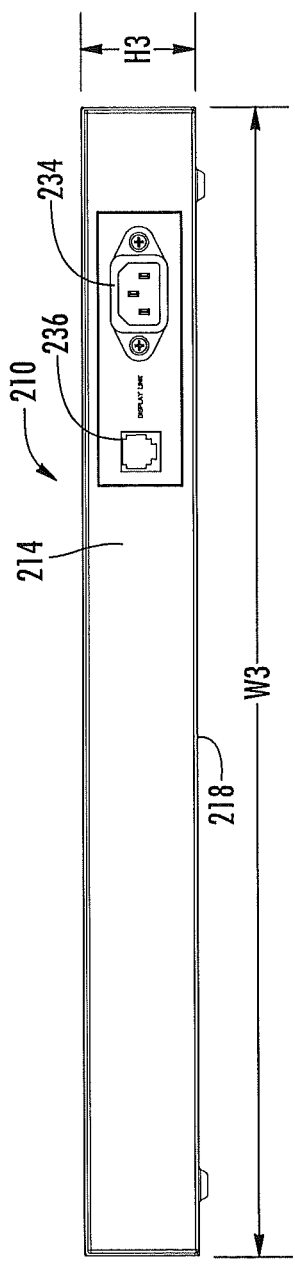
FIG. 20 is a rear view of the faceplate of FIG. 18.
Figure 21:
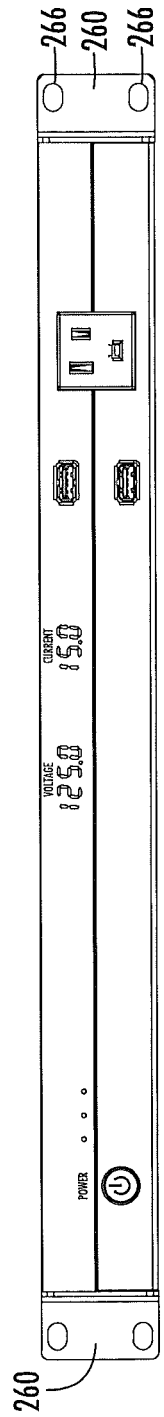
FIG. 21 is a front view of the faceplate of FIG. 18.

As illustrated in FIG. 19, the faceplate front panel 212 may include one or more status indictors (e.g., LEDs). These may include a safe voltage indicator 238, a surge protection indicator 240 and/or a ground indicator 242. These diagnostic indicators provide visual feedback for safe voltage, protection, a proper system grounding, respectively. The faceplate front panel 212 may also include a voltage meter display 244 to display AC line voltage of equipment connected to the power conditioner 10, 110 and a current meter display 246 to display current draw of equipment connected to the power conditioner 10, 110.

The faceplate front panel 212 may include one or more USB charging ports 248. In some embodiments, the USB charging ports 248 support up to 2 A total current draw to quickly recharge game controllers, tablets and other USB devices. The faceplate front panel 212 may also include at least one utility AC outlet 250. The outlet 250 provides convenient access to power for gaming systems, video cameras and other devices. A power control button 247 controls the switched outlets of the power conditioner 10, 110; the power control button 247 may be backlit to indicate that the outlets are turned on.

As illustrated in FIG. 18, the faceplate 210 may be connected to the front rails 94 of an equipment rack 90 via brackets 260. Each bracket 260 includes a front portion 262 configured to attach to a front rail 94 and a rear portion 264 configured to connect to the faceplate side panels 220, 222 (e.g., via the apertures 224).

The faceplate 212 may have a relatively small form factor. In some embodiments, the faceplate 212 has a height H3 of about 1.75 inches (i.e., about 1 U or 1 rack unit), a depth D3 of about 2.5 inches and a width W3 of about 17 inches. In this regard, the power conditioner 10, 110 and the faceplate 210 may be mounted in an equipment rack in a spaced-apart relationship, thereby freeing up space in the rack as well as providing space for cable management and/or ventilation. In some other embodiments, the height 113 may be less than about 1.75 inches, the depth D3 may be less than about 2.5 inches and/or the width W3 may be less than about 17 inches. At least the height and width may be selected such that the power conditioner may be accommodated in racks of various dimensions, including those of standard dimensions.

Figure 22:
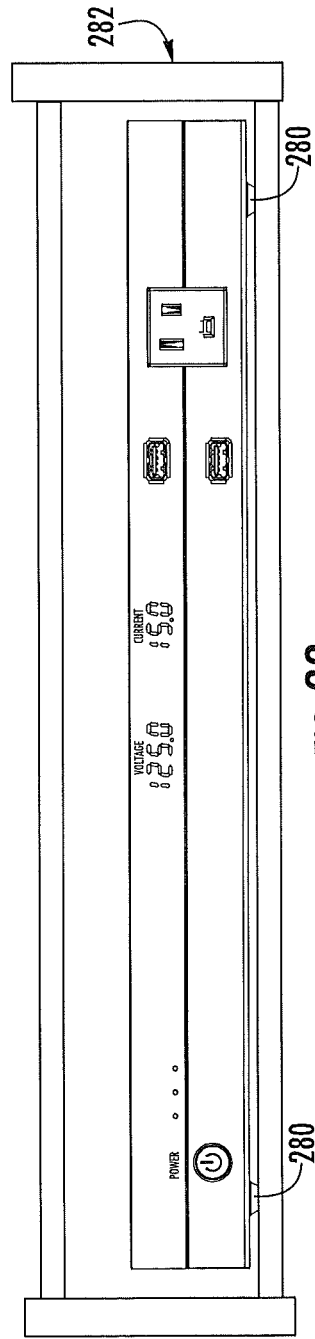
FIG. 22 is a front view of the faceplate of FIG. 18 residing in a cabinet.

The cords 226, 228 may have varying lengths to allow the faceplate 210 to be positioned in various locations relative to the power conditioners 10, 110. For example, the faceplate 210 may be positioned at various elevations at the front of the rack. Also, a plurality of rubber feet 280 may be provided. The rubber feet may be adhered or otherwise attached to the bottom panel 218 of the faceplate 210 such that it may rest on a flat or relatively flat surface (e.g., in a cabinet 282 as shown in FIG. 22).

It will be understood that at least certain of the features and advantages described above in reference to the power conditioners 10, 110 may be applied to other power products, such as Battery Backup-Uninterruptable Power Supplies (UPS) and Automated Voltage Regulators (AVR). For example, these additional power products may include the same or similar form factor to the power conditioners 10, 110 described above and/or may be selectably mountable in a plurality of different ways to a plurality of different mounting structures in the manner described above. These additional power products (or faceplates associated therewith) may include additional or alternative indicators for visual feedback (e.g., LEDs), such as for battery run time, system status, internet connection, auto reboot and the like.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

That which is claimed is:

1. An electronic device assembly, comprising:
    first and second brackets, wherein each one of the brackets has a rear portion adapted to attach to a rear portion of an equipment rack, wherein each one of the brackets has a front portion that extends frontwardly, and wherein each one of the brackets includes a top row of a plurality of apertures, a bottom row of a plurality of apertures, and a middle row of a plurality of apertures positioned between the top and bottom rows;
    an electronic device including a housing having a rear panel, a first side panel mounted to the first bracket and a second, opposed side panel mounted to the second bracket, wherein the rear panel includes a plurality of connections for connecting equipment, and wherein each of the first and second side panels includes at least four apertures;
    wherein the electronic device is mountable to the brackets in a plurality of orientations including:
        a rearward orientation with the rear panel oriented substantially vertically, wherein one of the at least four apertures of each side panel is aligned with one of the apertures of one of the top and bottom rows of one of the brackets and another one of the at least four apertures of each side panel is aligned with one of the apertures of the other one of the top and bottom rows of one of the brackets; and
        at least one angled orientation with the rear panel at an oblique angle relative to vertical, wherein two of the at least four apertures of each side panel are aligned with two of the apertures of the middle row of one of the brackets.

2. The electronic device assembly of claim 1, wherein the electronic device housing includes a top panel and a bottom panel, and wherein the at least one angled orientation comprises both of:
- an upward angled orientation, wherein at least a majority of the electronic device top panel is positioned further from the rear portions of the brackets than at least a majority of the electronic device bottom panel; and
- a downward angled orientation, wherein at least a majority of the electronic device bottom panel is positioned further from the rear portions of the brackets than at least a majority of the electronic device top panel.

3. The electronic device assembly of claim 2, wherein:
- in the upward angled orientation, two of the at least four apertures of each side panel are aligned with two of the apertures of the middle row of one of the brackets; and
- in the downward angled orientation, a different two of the at least four apertures of each side panel are aligned with two of the apertures of the middle row of one of the brackets.

4. The electronic device assembly of claim 2, wherein:
- the electronic device is mountable in an upward orientation, wherein the rear panel is substantially perpendicular to vertical and the top panel is positioned further away from the rear portions of the brackets than the bottom panel;
- the electronic device is mountable in a downward orientation, wherein the rear panel is substantially perpendicular to vertical and the bottom panel is positioned further away from the rear portions of the brackets than the top panel; and
- wherein in each of the upward and downward orientations, one of the at least four apertures of each side panel is aligned with one of the apertures of one of the top and bottom rows of one of the brackets and another one of the at least four apertures of each side panel is aligned with one of the apertures of the other one of the top and bottom rows of one of the brackets.

5. The electronic device assembly of claim 2, wherein:
- the electronic device is mountable in an upward orientation, wherein the rear panel is substantially perpendicular to vertical and the top panel is positioned further away from the rear portions of the brackets than the bottom panel;
- the electronic device is mountable in a downward orientation, wherein the rear panel is substantially perpendicular to vertical and the bottom panel is positioned further away from the rear portions of the brackets than the top panel; and
- wherein in each of the upward and downward orientations, two of the at least four apertures of each side panel are aligned with two of the apertures of one of the top and bottom rows of one of the brackets.

6. The electronic device assembly of claim 1, wherein adjacent apertures of each of the top and bottom rows of each bracket are spaced apart a first distance, and wherein adjacent apertures of the middle row of each bracket are spaced apart a second distance that is greater than the first distance.

7. The electronic device assembly of claim 1, wherein:
- the electronic device is mountable in a non-recessed orientation, wherein a pair of the at least four apertures of each side panel is aligned with a first aperture and a second aperture of one of the brackets; and
- the electronic device is mountable in a recessed orientation, wherein the pair of the at least four apertures of each side panel is aligned with a third aperture of one of the brackets that is located a greater distance from the rear portion of the bracket than the first aperture and a fourth aperture of one of the brackets that is located a greater distance from the rear portion of the bracket than the second aperture.

8. The electronic device assembly of claim 1, wherein the side panel apertures and aligned ones of and the bracket apertures are configured to receive a fastener therethrough to fixedly mount the electronic device to the brackets.

9. The electronic device assembly of claim 8, wherein the electronic device further comprises a threaded passageway extending inwardly from each of the side panel apertures.

10. The electronic device assembly of claim 1, wherein the electronic device is an electrical device.

11. An electronic device assembly, comprising:
- an equipment rack having first and second spaced-apart rear rails and first and second spaced-apart front rails, the first and second rear rails defining a rear vertical plane therebetween;
- a first bracket attached to the first rear rail and a second bracket attached to the second rear rail, wherein each of said brackets includes a rear portion attached to one of said rear rails and a front portion that extends frontwardly, and wherein each front portion includes a top row of a plurality of apertures, a bottom row of a plurality of apertures, and a middle row of a plurality of apertures positioned between the top and bottom rows;
- an electronic device including a housing having a rear panel, a first side panel mounted to the first bracket and a second, opposed side panel mounted to the second bracket, wherein the rear panel includes a plurality of connections for connecting equipment, and wherein each of the first and second side panels includes at least four apertures;
- wherein the electronic device is mountable to the brackets in a plurality of orientations including:
  - a rearward orientation with the rear panel substantially parallel to the rear vertical plane, wherein one of the at least four apertures of each side panel is aligned with one of the apertures of one of the top and bottom rows of a one of the brackets and another one of the at least four apertures of each side panel is aligned with one of the apertures of the other one of the top and bottom rows of one of the brackets; and
  - at least one angled orientation with the rear panel at an oblique angle to the rear vertical plane, wherein two of the at least four apertures of each side panel are aligned with two of the apertures of the middle row of one of the brackets.

12. The electronic device assembly of claim 11, wherein the electronic device is sized such that, when mounted, the electronic device extends only a minor distance from a rear portion to a front portion of the rack.

13. The electronic device assembly of claim 11, wherein the electronic device has a width of about 17 inches.

14. The electronic device assembly of claim 11, wherein the electronic device includes a front panel having at least one interface, the assembly further comprising a faceplate mountable to the front rails of the rack in a spaced-apart relationship to the electronic device, the faceplate having a housing including a rear panel having at least one interface for interconnection with the at least one interface of the electronic device and a front panel having at least one indicator for monitoring the electronic device.

15. The assembly of claim 14, wherein the front panel of the faceplate includes at least one display for real-time display of operating conditions associated with the electronic device.

16. The assembly of claim 14, wherein the front panel of the faceplate includes diagnostic LEDs to provide visual feedback of operating conditions associated with the electronic device.

17. The assembly of claim 14, wherein the front panel of the faceplate includes at least one of a USB charging port and a utility outlet.

18. The assembly of claim 14, wherein the faceplate has a width of about 17 inches.

19. The electronic device assembly of claim 11, wherein the electronic device is an electrical device.

20. An electronic device kit, comprising:
- an electronic device including a housing having a rear panel including a plurality of connections for connecting equipment, the electronic device including first and second opposed side panels, each side panel including at least four apertures;
- a pair of first brackets, wherein each of the first brackets is adapted to attach to a rear portion of an equipment rack, and wherein each first bracket has a front portion that extends frontwardly, wherein each one of the first brackets includes a top row of a plurality of apertures, a bottom row of a plurality of apertures, and a middle row of a plurality of apertures positioned between the top and bottom rows, and wherein the electronic device is mountable to the front portions of the first brackets in a plurality of orientations including:
  - a rearward orientation with the rear panel oriented substantially vertically, wherein one of the at least four apertures of each side panel is aligned with one of the apertures of one of the top and bottom rows of one of the first brackets and another one of the at least four apertures of said side panel is aligned with one of the apertures of the other one of the top and bottom rows of one of the first brackets; and
  - at least one angled orientation with the rear panel at an oblique angle relative to vertical, wherein two of the at least four apertures of each side panel are aligned with two of the apertures of the middle row of one of the first brackets; and
- a pair of second brackets, wherein each of the second brackets includes first and second substantially perpendicular portions, wherein each second portion includes a plurality of apertures, and wherein:
  - the first portion of each of the second brackets is adapted to attach to the rear portion of the equipment rack, and the electronic device is mountable to the second portion of the second brackets with at least two apertures of each side panel aligned with at least two apertures of one of the second portions; and
  - the first portion of each of the second brackets is adapted to attach to a flat mounting surface, and the electronic device is mountable to the second portion of the second brackets with at least two apertures of each side panel aligned with at least two apertures of one of the second portions.

21. The kit of claim 20, wherein the electronic device housing includes a bottom panel, the kit further comprising a plurality of feet attachable to the bottom panel such that the electronic device may rest on a flat surface.

22. The kit of claim 20, wherein the electronic device is an electrical device.

* * * * *

UNITED STATES PATENT AND TRADEMARK OFFICE
CERTIFICATE OF CORRECTION

| | | |
|---|---|---|
| PATENT NO. | : 9,131,619 B2 | Page 1 of 1 |
| APPLICATION NO. | : 14/224918 | |
| DATED | : September 8, 2015 | |
| INVENTOR(S) | : Moore et al. | |

It is certified that error appears in the above-identified patent and that said Letters Patent is hereby corrected as shown below:

On Title Page:
Item (71), delete "Wirepath Home Systems, LLC, Charlotte, NC (US)"
      insert -- Wirepath Home Systems, LLC, d/b/a SnapAV, Charlotte, NC (US) --

Item (73), delete "Wirepath Home Systems, LLC, Charlotte, NC (US)"
      insert -- Wirepath Home Systems, LLC, d/b/a SnapAV, Charlotte, NC (US) --

In the Claims:
Column 20, Claim 11, Line 40: delete "of a one of the brackets"
      insert -- of one of the brackets --

Signed and Sealed this
Twenty-sixth Day of April, 2016

Michelle K. Lee
*Director of the United States Patent and Trademark Office*